United States Patent [19]
Stern et al.

[11] Patent Number: 5,371,375
[45] Date of Patent: Dec. 6, 1994

[54] METHOD FOR OBTAINING THREE-DIMENSIONAL DATA FROM MULTIPLE PARTS OR DEVICES IN A MULTI-POCKETED TRAY

[75] Inventors: Howard Stern, Greenlawn; William Yonescu, Dix Hills; Joseph Vaiana, Miller Place; Alex Mauro, Wheatley Heights, all of N.Y.

[73] Assignee: Robotic Vision Systems, Inc., Hauppauge, N.Y.

[21] Appl. No.: 921,317

[22] Filed: Jul. 28, 1992
(Under 37 CFR 1.47)

Related U.S. Application Data

[63] Continuation-in-part of Ser. No. 903,524, Jun. 24, 1992.

[51] Int. Cl.⁵ .................................... G01N 21/86
[52] U.S. Cl. .................................... 250/561; 356/376
[58] Field of Search .................... 250/234, 560, 561; 356/376, 375, 1

[56] References Cited

U.S. PATENT DOCUMENTS

| | | | |
|---|---|---|---|
| 5,027,281 | 6/1991 | Rekow et al. | 356/376 |
| 5,103,105 | 4/1992 | Ikegaya et al. | 250/561 |
| 5,139,338 | 8/1992 | Pomerantz et al. | 356/376 |

*Primary Examiner*—David C. Nelms
*Attorney, Agent, or Firm*—Max Fogiel

[57] ABSTRACT

Methods and arrangements are provided to efficiently use 3-D vision systems to measure selected features of objects that are semi-constrained in compartmented trays having a uniform geometric arrangement. The methods are particularly well suited for optimizing the 3-D measurement of leads on integrated circuit devices which are packaged in trays.

2 Claims, 22 Drawing Sheets

METHOD FOR OBTAINING THREE-DIMENSIONAL DATA FROM MULTIPLE PARTS OR DEVICES IN A MULTI-POCKETED TRAY

The present application is a continuation-in-part of the copending parent application Ser. No. 903,524 filed Jun. 24, 1992.

BACKGROUND OF THE INVENTION

This present invention relates to increasing the utility of 3-D triangulation sensors which inherently take longer to gather data as their field of view is widened (at constant resolution).

The operation and application of 3-D triangulation sensors is well known in the art and is exemplified by U.S. Pat. Nos. 4,238,147, 4,590,367 and 5,028,799 which teach the relative motion between a sensor that projects a plane of light on an object whose surface data is to be recorded and the object itself. The plane of light may be formed by a collimated laser beam spread by a cylindrical lens or by a spot of light which is deflected by a mirror mounted on a galvanometer, mechanical motion, spinning mirror, or acoustooptic deflector to form an equivalent plane made of a group of spots. The surface depth information is obtained by reading a signal for each part of the plane from a position sensing detector which may be a TV camera, a linear photodiode array, or a linear or area type photoconductive device which provides a voltage ratio proportional to the x and/or y position of an incident light spot. All of these detectors and their use for range readout in 3-D triangulation systems are well known by those versed in the state of the art.

When a scanned spot is used to create the light plane and each spot is immediately read out from the detector, the scan time to scan a given area increases in proportion to the number of spots since a finite time is required to project the light energy and to read out the data for each spot. When an integrating device such as a TV camera is used to gather the data from a projected plane (or equivalent group of spots) the width that can be accommodated is defined by the resolution of a pixel (often 1/512th of the length or width of the detector) and the corresponding resolution desired on the object. This follows from the typical camera pickup resolution created by a 512 by 512 pixel array. The readout time for the 3-D data contained in the projected plane corresponds to the time to read the picture frame which is normally 1/30th of a second. Thus, again, the number of 3-D points scanned and read out is limited by time available; typically 512 3-D points in 1/30th of a second.

3-D sensors are often translated via mechanical means which carry the sensor along its intended measurement path, often at a constant velocity. Any time the path is changed from a straight line or changes to a new straight line path, it is required that the mechanism be accelerated and/or decelerated which often slows the net scanning speed far below what would be achieved if acceleration were not required. This is particularly a problem when scanning around the periphery of a particular semiconductor device in a tray since it requires three changes of direction to scan leads on the four sides of the device. It is an important object of this invention to significantly reduce the number of times this acceleration/deceleration is required.

SUMMARY OF THE INVENTION

It is the object of the present invention to significantly reduce the amount of data and time that must be used to scan objects in compartmented trays. A first reduction can be implemented by changing the scan pattern from one that scans the four sides of an object (device) in sequence to a scan pattern that scans across the entire tray, either by row or by column, and covers the corresponding sides of the devices in that row or column. This method significantly reduces the number of direction changes that are required and thus reduces the number of acceleration/deceleration cycles required and simultaneously reduces their importance since they are spaced much farther apart in both distance and time.

A second reduction significantly reduces the area that must be scanned as a result of the positional uncertainty created by devices that fit loosely in their pockets and therefore are free to shift significantly with respect to the scan area dimensions, thus requiring that excess area be scanned to insure covering the region of interest. The problem of positional uncertainty is solved via means that are introduced to bank the devices to the same known corner or side of their respective pockets through directional vibration that may be achieved by a combination of vertical vibration of the tray and gravity.

It is the object of this invention to further reduce the area that must be scanned by using apriori knowledge of the geometry of the devices to be scanned, and a first scan of one side of all of the devices to gather information that may be used to reduce the area that must be subsequently scanned on the next one or three sides of the devices for device packages with leads on two or four sides, respectively.

It is a further object of this invention to reduce scan areas even further by obtaining the apriori knowledge of the devices by scanning one or more devices of a lot on all four sides so that detail geometric knowledge is available when one device of a lot is so scanned and a better geometric estimate of the lot geometric characteristics and variability is available when more than one device is scanned.

It is a further object to perform both of the above tasks for cases where the devices are randomly oriented in the tray pockets, banked to one wall of the tray pockets, or banked to two orthogonal walls of the tray pockets.

DESCRIPTION OF THE PREFERRED EMBODIMENTS

Figure 1:
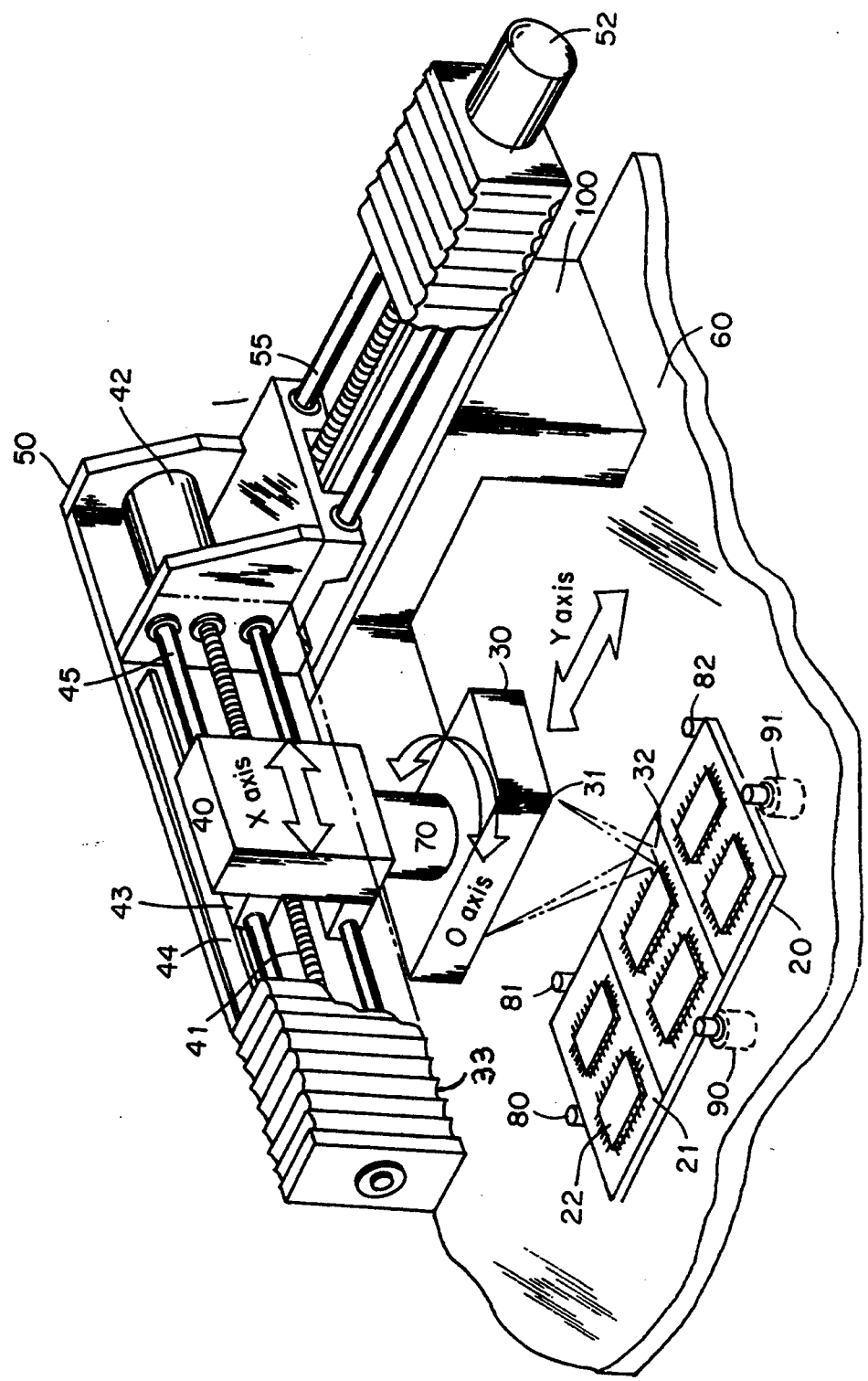
FIG. 1 is a schematic view of the preferred embodiment of the invention and shows a 3-D sensor system mounted to an X-Y- motion system along with a tray of devices to be scanned that are located in an assembly suitable for banking the parts against the walls of the tray compartments.

FIG. 1 shows the components needed for a preferred embodiment to practice the invention. The 3-D sensor 30 is attached to an x, y, theta motion mechanism 100, which is mounted to plate 60 which forms the base for the tray of devices and the banking pins 80, 81, 82 and the lift and vibrate units 90 and 91. The y carriage 50 is driven by motor 52 via lead screw 51 and supported by linear shaft 55 and bearings 53. The y linear encoder 54 is used to extract exact y positional information as the table is driven. The y carriage 50 forms the base for the x axis drive motor 42, x axis lead screw 41 and the x axis linear shafts 45. The x axis head 40 is supported by linear bearings 43 and its position indicated continuously by linear encoder 44. The x axis head 40 supports rotary theta axis 70 which in turn supports 3-D sensor 30. Light plane or flying spot projector 31, internal to sensor 30, projects a light plane or series of spots which illuminate the surface of tray 20 at the line or equivalent series of spots 32. Individual semiconductor devices 22 that are to be inspected lie in tray pockets 21.

Figure 2:
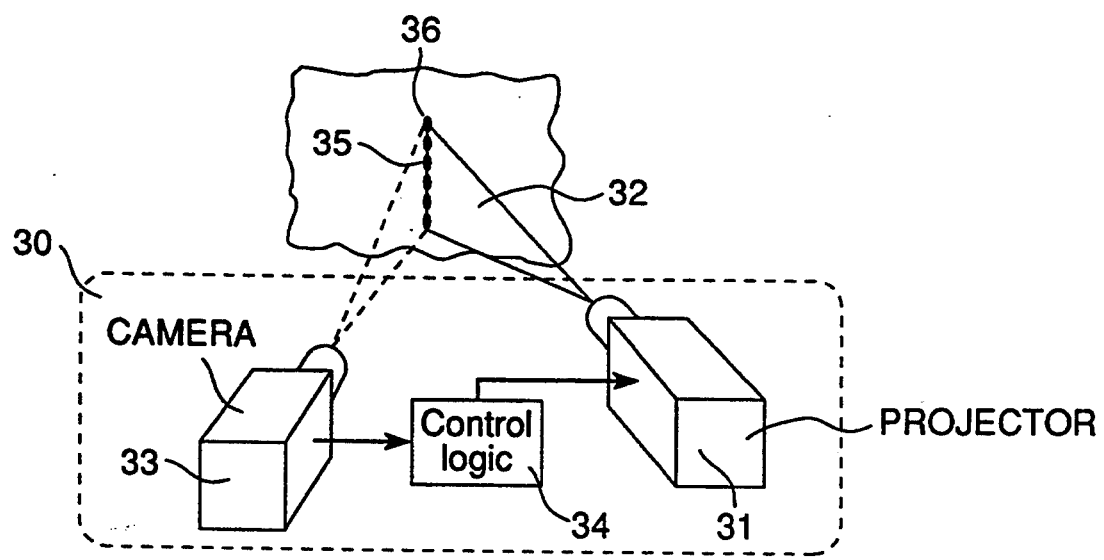
FIG. 2 is a schematic showing the use of a camera and plane of light projector which illustrates a basic 3-D sensor construction.

FIG. 2 shows a detail schematic of the sensor 30, camera 33, projector 31, control logic for timing and light control 34 and light plane 32. The light spots 35 that can substitute for the light plane 32 when using the alternate of a flying spot projector 31 are also shown. As can be appreciated from the FIG. 2 schematic, the mechanical scan motion must be approximately at right angles to the line of intersection of the plane of light with the object, 36, in order to scan a swath of reasonable width. This is the reason for the rotary axis 70 in FIG. 1. The rotary axis is turned according to the direction of mechanical scan to keep the line of intersection approximately at a right angle with the direction of motion. If the motion is restricted to pure scans in the x direction and y direction only, then the rotary axis may be eliminated and the sensor head replaced with one containing two 3-D sensors at right angles to each other. One sensor would be oriented so that its light plane is positioned properly for x scan motion and the other would be positioned to have its light plane oriented properly for y scan motion. Sensor output would be chosen according to the direction of scan.

Figure 3:
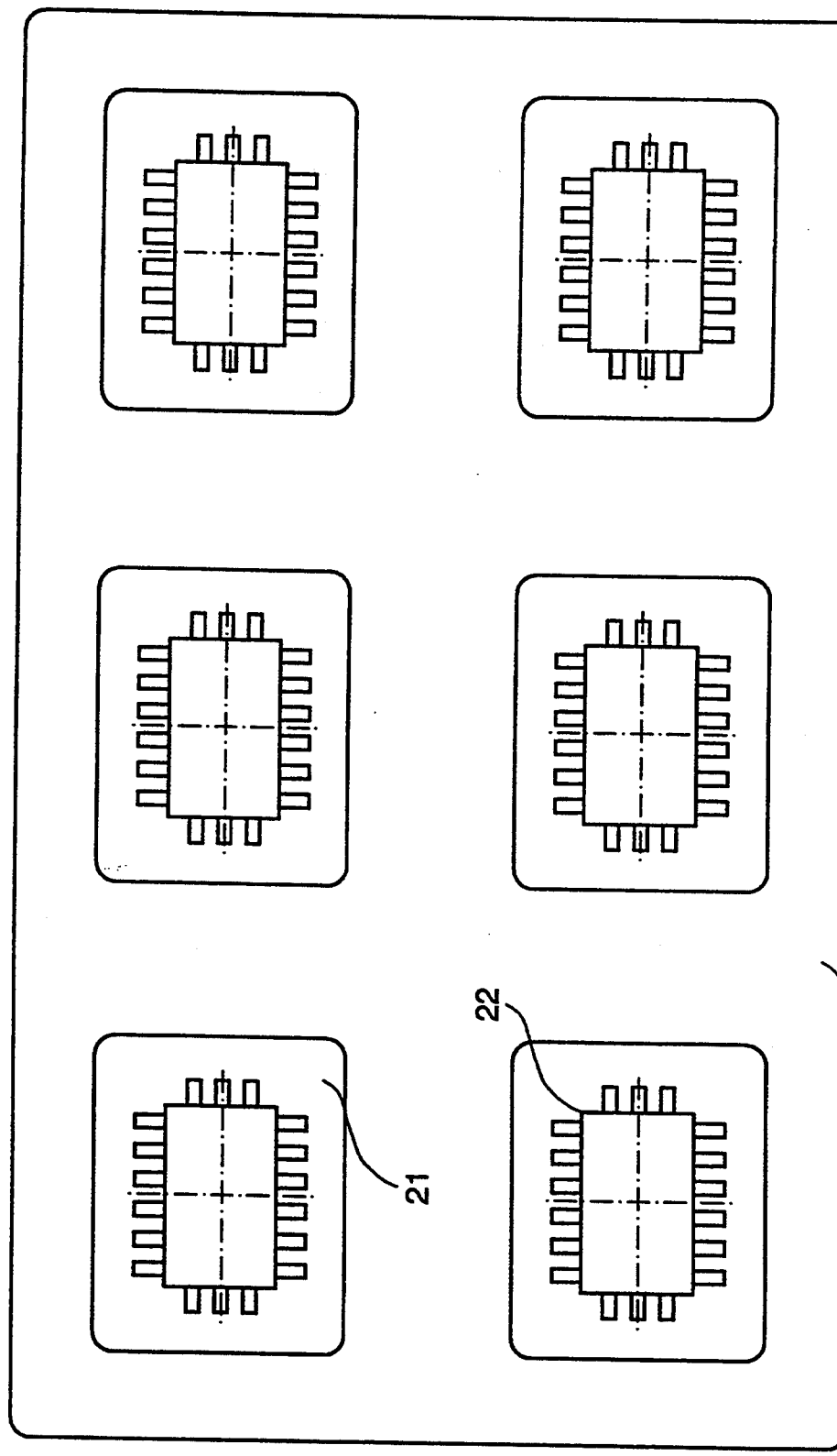
FIG. 3 is a top view of a tray of devices with all devices centered in their respective pockets.

FIG. 3 shows the appearance of devices 22 which are located exactly in the center of their respective pockets 21 in tray 20. The devices are also shown with their sides exactly parallel to the sides of the pocket. This is the appearance in the ideal case and may actually occur when the tray pockets are only marginally larger than the devices. Making the pockets only marginally larger than the devices is not necessarily a good practice because it may lead to damage to the fragile leads when inserting the device 22 into the pocket 21.

Figure 4:
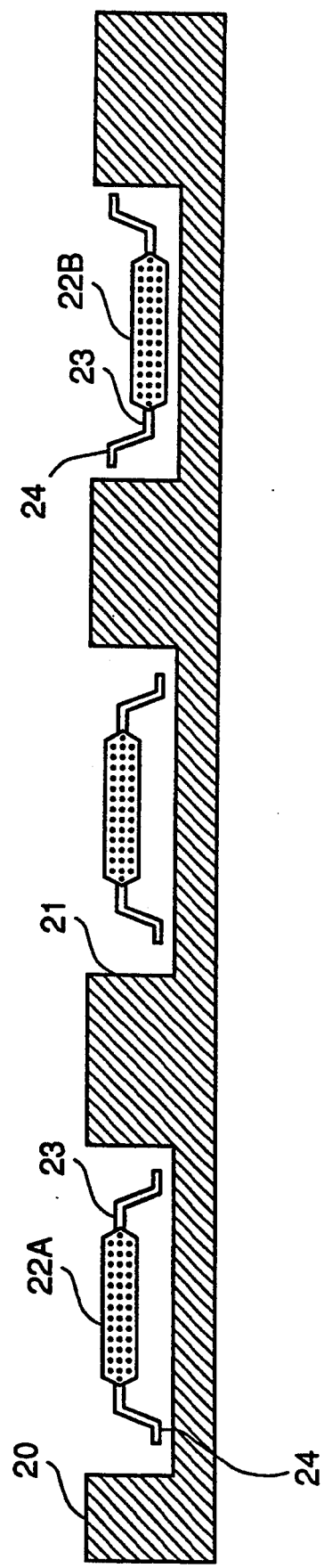
FIG. 4 is a section view of a tray of devices showing live bug and dead bug part positioning.

FIG. 4 is a cross section view of the tray 20 showing the relationship between the pockets 21, the devices 22A and 22B and the device leads 23. As is illustrated, the devices may be inserted into the tray either right side up 22A (live bug) or up side down, 22B (dead bug). Also shown is the region of the leads that is most critical to semiconductor quality with regard to placement of the lead tips 24 on a printed circuit board. Because the exact location of the lead tips 24 is very critical, it is desirable to scan them at the highest possible resolution. This entails crowding as many 3-D data points as possible into the region encompassing the lead tips 24 and is the equivalent of using a high magnification when performing inspection with 2-D machine vision.

Figure 5:
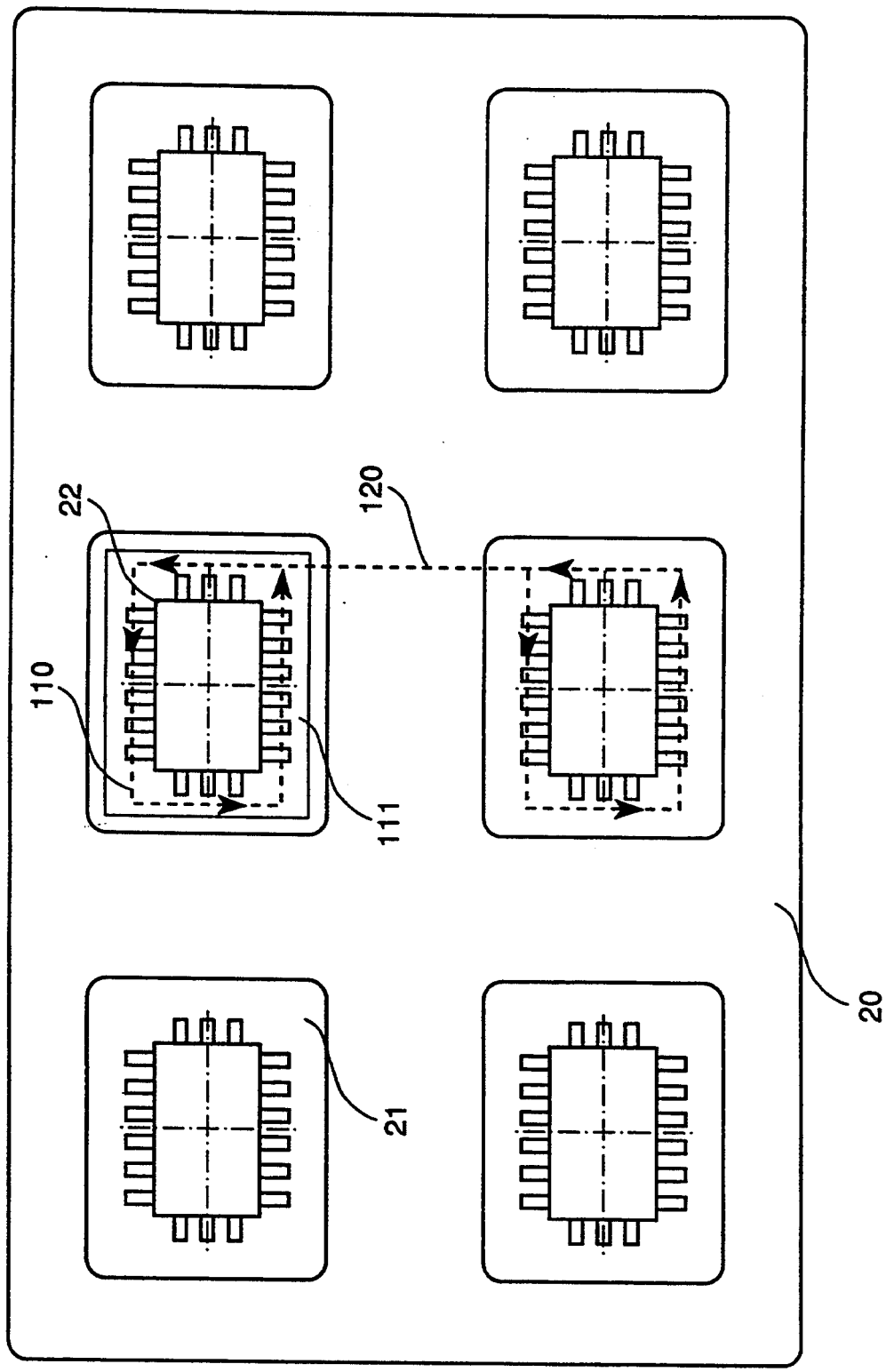
FIG. 5 is a top view of a tray of centered devices showing the 3-D sensor scanned area and the path used to gather data from the lead tips of two devices.

FIG. 5 shows a top view of the tray 20, pockets 21, centered devices 22 and a scan path around a device, 110, which produces a scanned area 111 encompassing the lead tips 24, which satisfies the requirement for obtaining detailed high resolution 3-D data. This method of scanning which is commonly employed is severely encumbered by the need for frequent acceleration and deceleration and additionally requires that the sensor be rotated (when an arrangement with one 3-D sensor in the head and a rotary axis is used) for each of the four straight line segments making up the rectangular donut-shaped scan area 111. Similarly, each of the segments requires that one axis, either x or y, be accelerated up to scan velocity and then be decelerated to a stop. During each scan corresponding to a segment the 3-D data for the lead tips 24 on one side of a device are captured. The number of acceleration/deceleration pairs required is equal to a minimum of four times the number of devices since each device has four sides. Each acceleration/deceleration pair adds a significant amount of extra time to the scan time which would otherwise be needed; the result is performance that is significantly degraded from what would be predicted by scan time requirements alone. This does not take into account the acceleration/decelerations that are required to travel from device to device.

Figure 6:
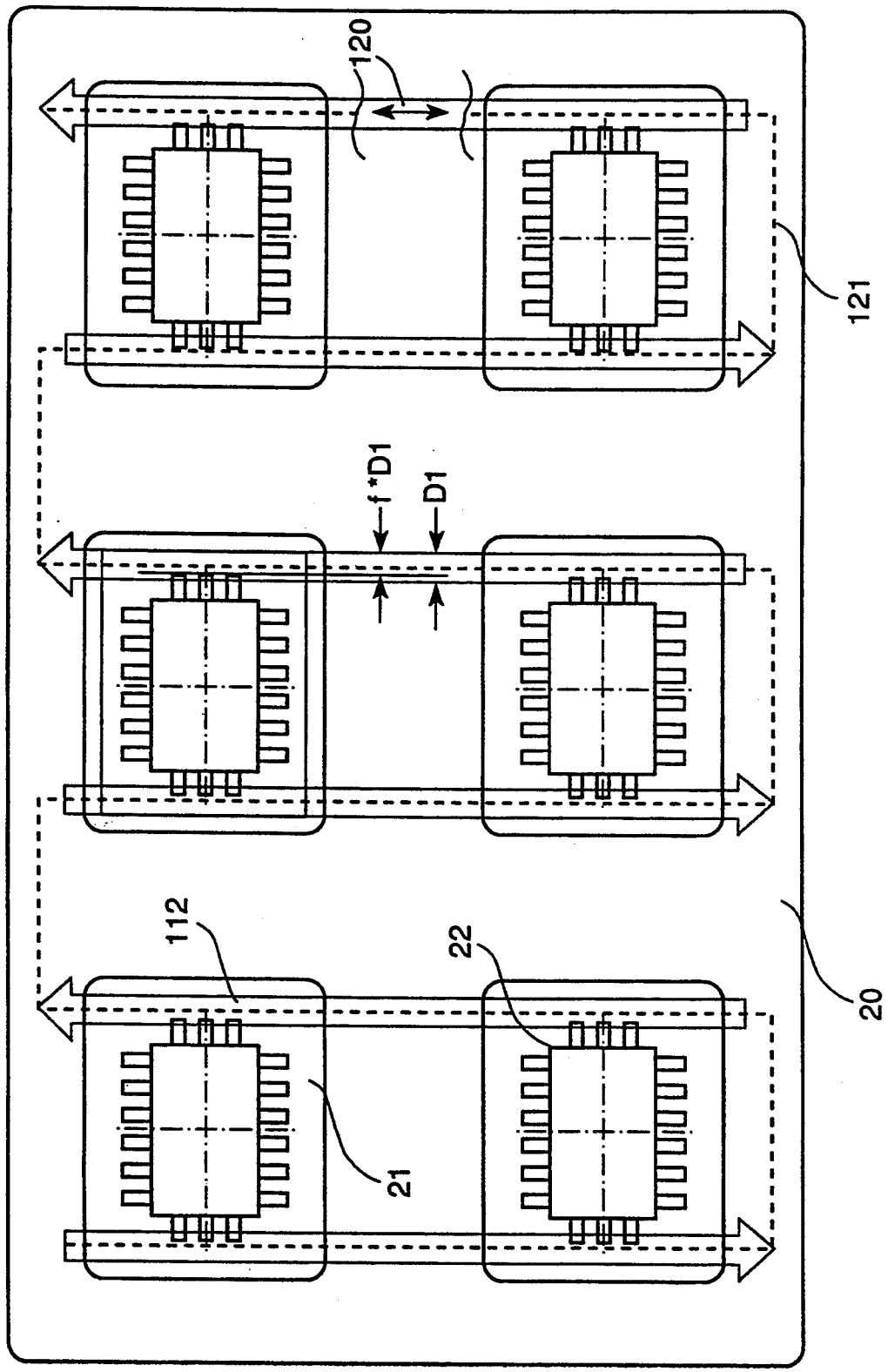
FIG. 6 is a top view showing the 3-D sensor scanned area and the path used to scan the lead tips on the short sides of the devices when they are centered in their respective pockets.
Figure 7:
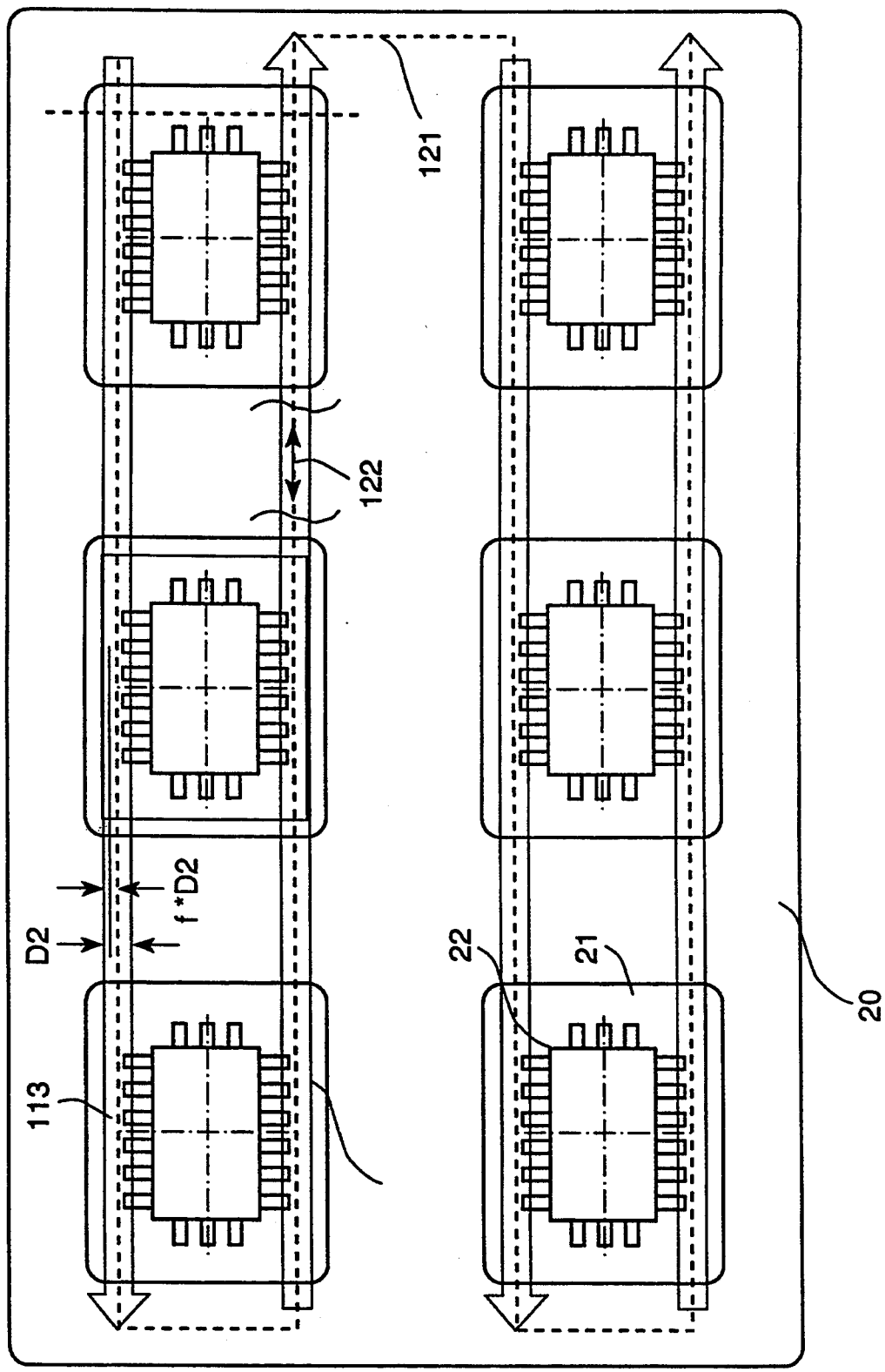
FIG. 7 is a top view of the 3-D sensor scanned area and the path used to scan the lead tips on the long sides of the devices when they are centered in their respective pockets.

FIG. 6 and FIG. 7 show the top view of the same tray 20 with centered devices 22 in tray pockets 21 but the scan area segments now extend contiguously across several devices along the short dimension of the tray (112 in FIG. 6) and along the long dimension of the tray (113 in FIG. 7). This reduces the number of straight line segments (and therefore acceleration/deceleration pairs) drastically, since the pairs now number two times the sum of the number of rows plus columns. This does not take into account the acceleration/decelerations that are required to travel from one scan to the next but the number of such short paths, 121, are far fewer than the number of moves between devices, 120, in the previous method. For instance, a tray with eight rows of sixteen devices in each row (e.g., 16 columns) would hold 128 devices and would require therefore at least 512 acceleration/deceleration pairs in scanning according to the FIG. 5 pattern. However, in the method shown in FIGS. 6–7 only 48 acceleration/deceleration pairs are required which is equal to the sum of the rows and columns multiplied by two. Further, although FIGS. 6–7 make it appear that there is substantial wasted scan path between devices this can be seen to lessen significantly as the number of rows and columns increase. Further, since 3-D data need not be taken in the intervals (122) and these areas are remote from areas where 3-D data must be taken (areas with leads) the motion or scanning velocity may be significantly increased during travel over these intervals without concern for induced vibration, etc. In FIG. 6 and FIG. 7 dashed lines have been placed in scan paths where it is not necessary to take 3-D data. This convention has been followed in all subsequent drawings.

FIG. 6 and FIG. 7 also identify the desired width of the short scans, D1, and the desired width of the long scans, D2, respectively. Further, associated with each such scan is a fraction, f, of the scan width that is required as overscan —scan that is desired to insure that enough 3-D data exists to allow proper identification of the exact ends of the lead tips.

Figure 8:
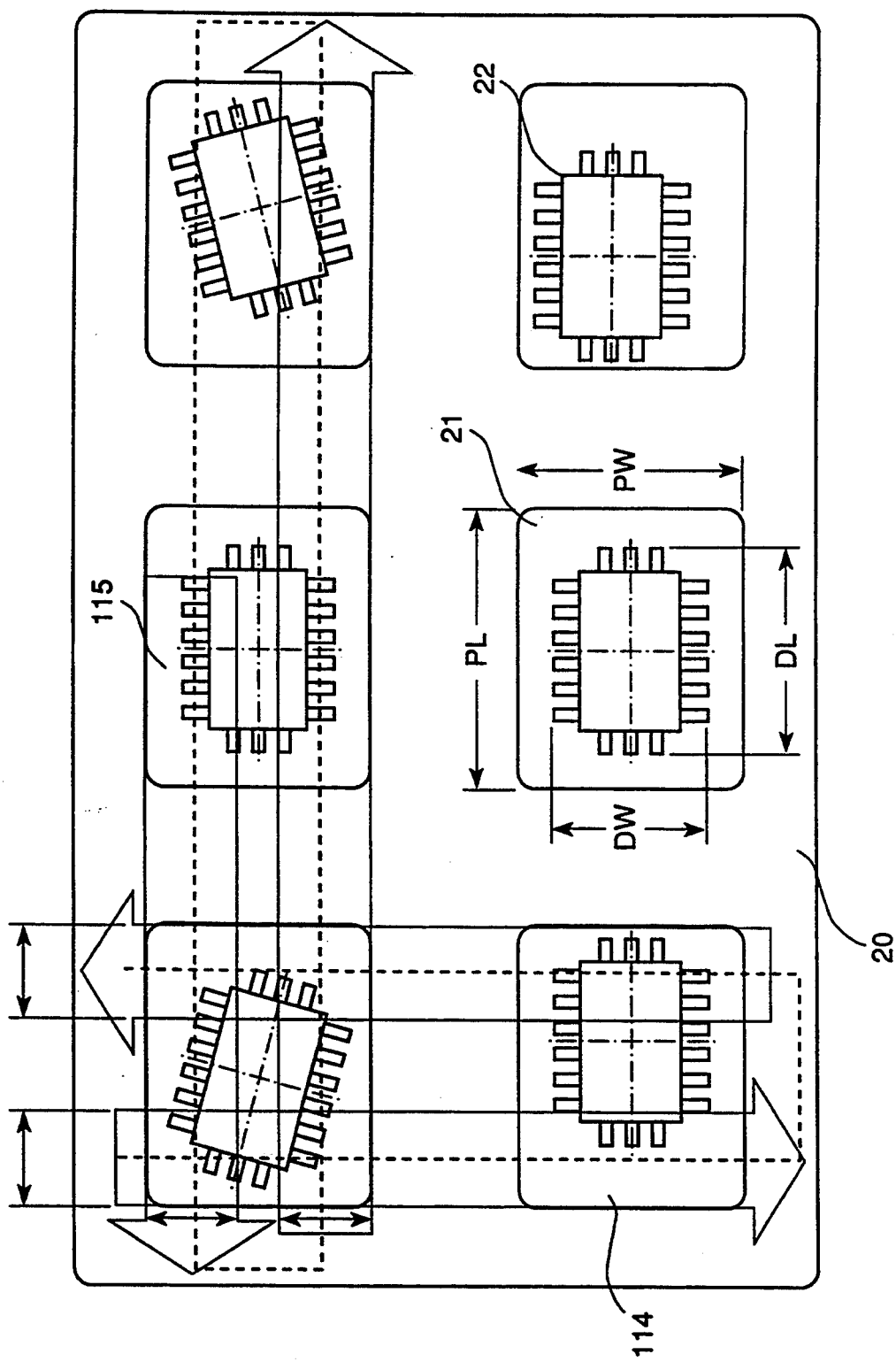
FIG. 8 is a top view showing a random arrangement of parts where they are not centered in their respective pockets and illustrative of the relationship between the part dimensions and the pocket dimensions.
Figure 9:
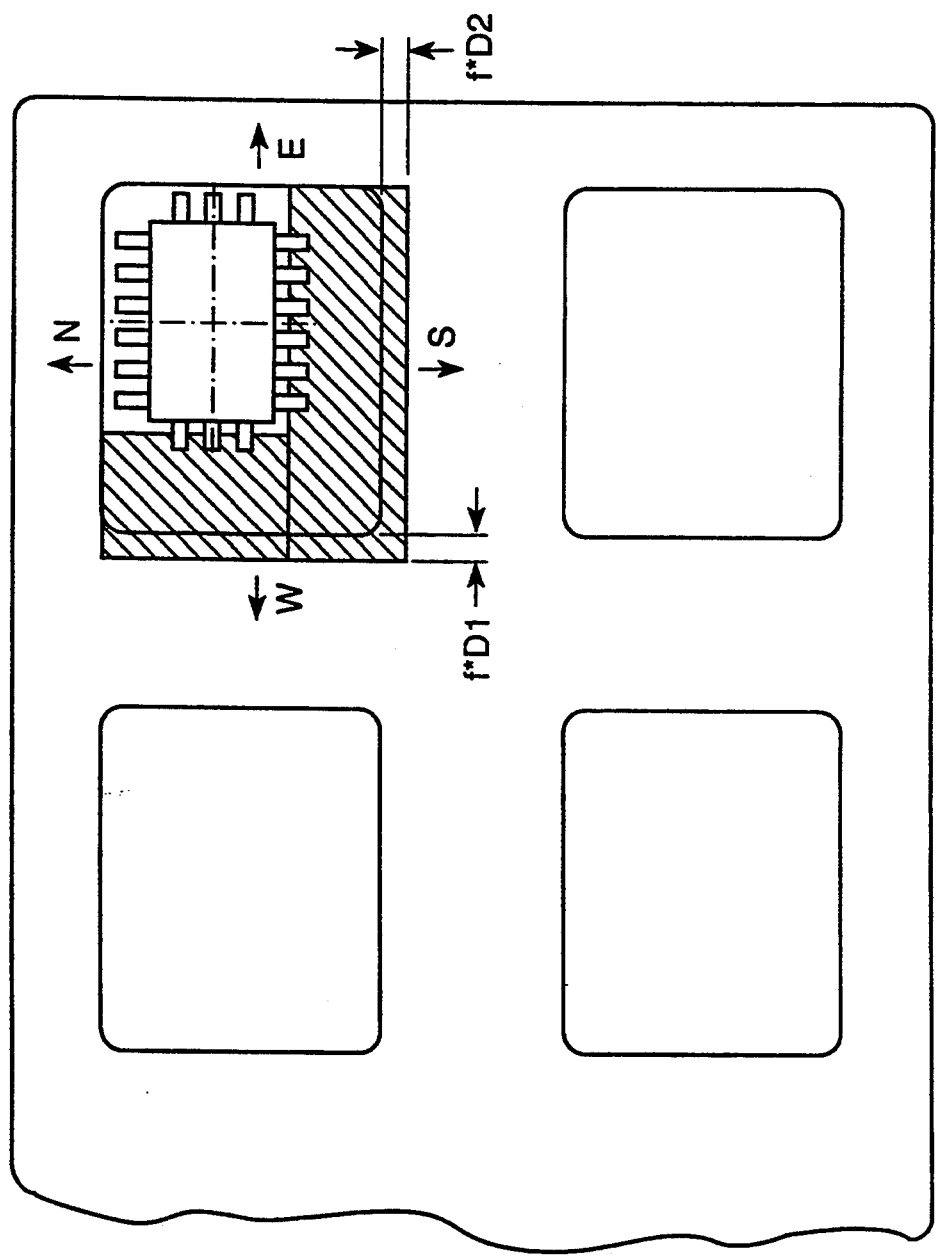
FIG. 9 shows a top view of the worst case scan area that must be covered to ensure gathering data for the lead tips on two orthogonal sides of a device in an unknown position in a pocket.

FIG. 8 shows the tray 20 with devices 22 that fit loosely in the pockets 21 so that the devices are significantly rotated and translated with respect to the known positions of the tray pockets. FIG. 8 also identifies key dimensions of the devices 22 and the pockets 21. It can be immediately seen that since there is no knowledge of exactly where the leads are located in the pocket it is necessary to perform a significant amount of overscanning to insure that the lead tips are scanned and the 3-D data obtained. The widened scan areas are shown (113, 114) in FIG. 8. Given that the pocket length and width are PL and PW, respectively, and that the device length and width are DL and DW, respectively, we can compute the overscan required. The maximum linear motion of the leads can be seen to occur when the device is banked to diagonally opposite corners of a pocket. This case is shown in FIG. 9. The device is shown banked to the upper right hand side of the pocket. It can be immediately seen that if the device were to be banked in the lower left corner of the pocket, the device motion would be $PW-DW$ in the x direction (as defined in FIG. 1) and $PL-DL$ in the y direction (as defined in FIG. 1). The width of each of the areas to be scanned will therefore increase to $PL-DL+f,D1$ in the y direction (from D1) and will increase to $PW-DW+f,D2$ in the x direction (from D2). The terms f*D2 and f*D1 come from the lead tip overscan as defined in FIG. 6 and FIG. 7, respectively.

Figure 10:
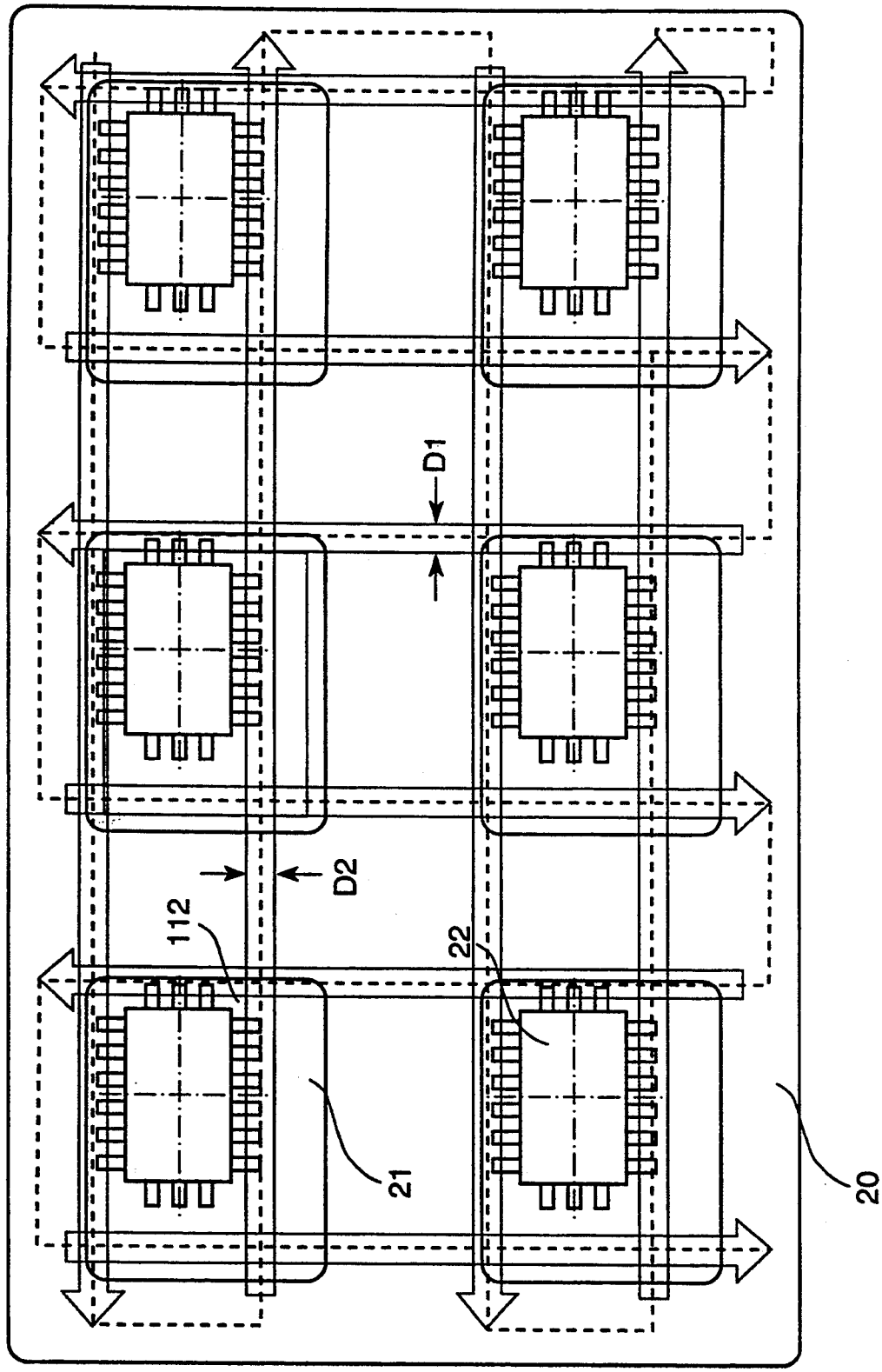
FIG. 10 is a top view illustrative of the devices in a tray when they are all banked to the same corner of their respective pockets and the resulting scanned areas and paths that may be employed when scanning the lead tip.

The scan areas as expanded by uncertainty introduced by the loose fit of devices in the tray pockets can be significant multiples of the original areas that had to be scanned when the devices were fixed in known positions. Accordingly, it is a further objective of the present invention to remove the uncertainty by always banking the devices to the same known corner of their respective pockets before the scanning process is begun. This is shown in FIG. 10, along with new scan paths that are translated versions of the FIG. 6 and FIG. 7 scan paths where the translations are those required to account for the shift of the devices from the center of the pockets to one corner of the pockets. The new scan paths are therefore shifted in x by one half of $(PW-DW)$ and shifted in y by one half of $(PL-DL)$. Banking of the devices to a known corner and the shifting of the rectangular scan pattern of FIG. 5 according to such banking will significantly improve the scan time required as compared to adding new areas to be scanned when the devices are loosely located in the pockets.

Figure 11:
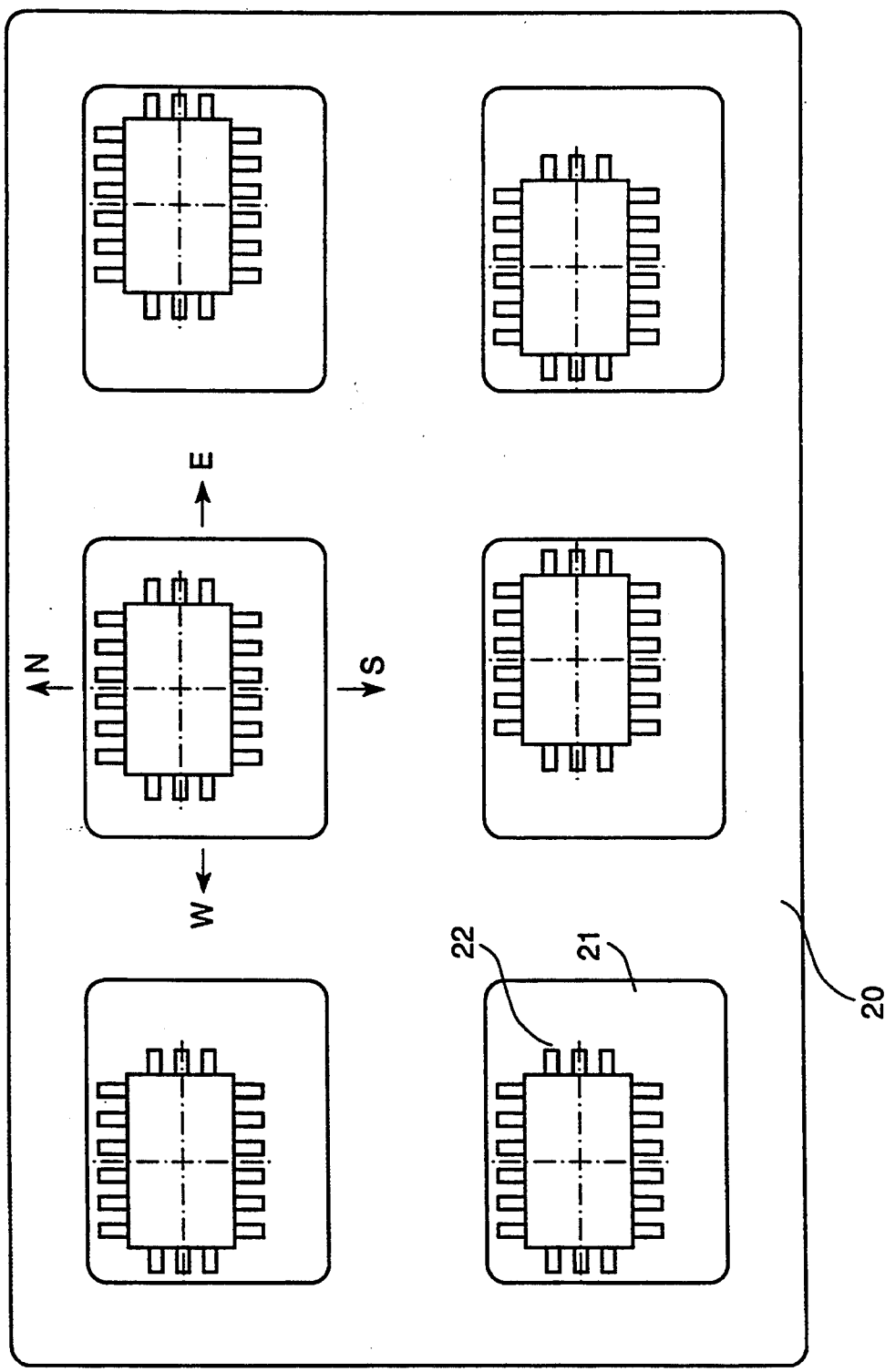
FIG. 11 is a top view illustrative of the devices in a tray when they are banked against the long side of the pocket only.

An alternative method of compensating for devices that are loosely located in pockets is to bank the devices to one side of the pockets rather than to one corner. This method is particularly useful when the devices are relatively tight in the pocket in one direction but relatively loose in the other. Accordingly, banking against the wall of the pocket in the loose direction of fit is all that is required to remove the necessity of otherwise increasing the scan area in such cases. Even if there is looseness in both directions, banking against one wall will significantly reduce the amount of overscan that would otherwise be required. This is shown in FIG. 11 where the devices are shown banked against the long wall of the tray pockets. Such a configuration would be handled using long narrow (normal) scans (see 113 of FIG. 7) in the y direction and the short wide (due to overscan) scans 114 of FIG. 8 in the x direction.

Figure 12:
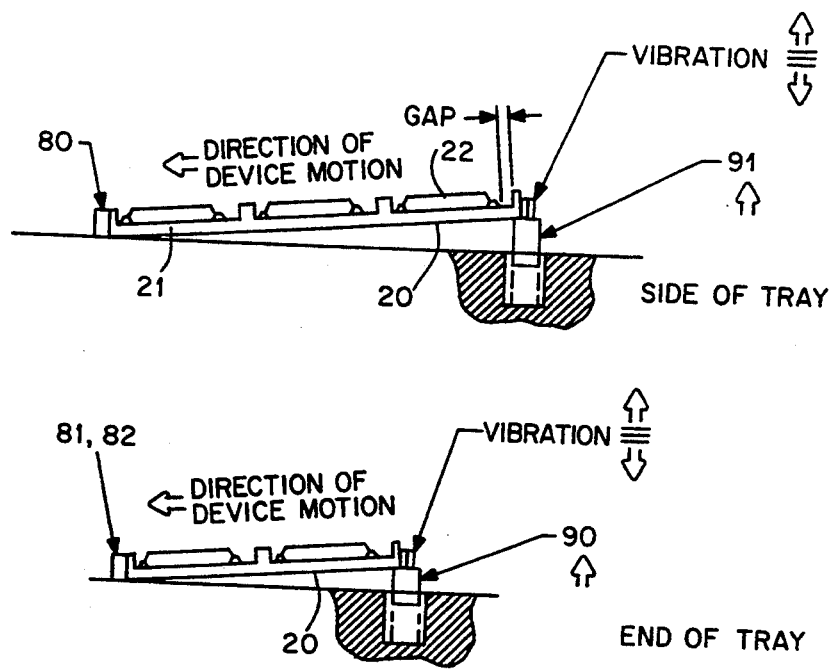
FIG. 12 is a section view of a lift and vibration device that banks the devices against the lower walls of their respective pockets (parallel to the short side of the tray)

A useful apparatus for accomplishing the banking of devices against the pocket walls and/or corners is shown in FIG. 1 and FIG. 12. Banking pins for the tray, 80 on the short side of the tray and 81, 82 on the long side of the tray prevent tray motion when lift and vibration units 91 on the short side and 90 on the long side are activated.

Each lift and vibration unit lifts one edge of the tray when its solenoid mechanism is activated with a D.C. current that slowly rises to a value required to lift the edge to the desired height. Upon reaching the desired height the current is modulated with a small A.C. component that increases from zero to a maximum value and then slowly decreases to zero again. It can be seen that the result will be to raise one edge of the tray from its position flat on table 60 to a nominal height, and then vibrate the tray so that the static friction holding the devices is broken whereupon they will slide with gravity's assistance to the lower wall of the pocket. The D.C. current is then slowly reduced to zero, and this gently lowers the tray which now has all of its devices banked to one side, back to the horizontal position.

For instance, starting with a tray of devices that are randomly oriented in their pockets (see FIG. 8) the lift and vibrate mechanism 90 is activated to go through the complete cycle outlined above. This will result in the tray configuration of FIG. 11 where the devices are banked against the long side. The lift and vibrate unit 91 may now be activated to go through a similar cycle which will bank the devices against the short sides of the pockets; the devices will now be banked against the pocket corners as shown in FIG. 10. Other forms of vibration and lifting (including lifting one tray corner) may be employed (including directional vibration which is well known and used in part feeders) to achieve the same ends; banking of the devices against the tray pocket walls or corners.

The preceding embodiments increase speed by lengthening scan paths between reversals and reduce the areas over which data must be scanned by improving knowledge of device positioning with respect to the tray pockets via banking of devices. However, there are significant locational uncertainties inherent in the geometry of the trays, the clamps or pins that locate the trays, and the devices themselves. These uncertainties force an increase in the required scan widths.

Figure 13:
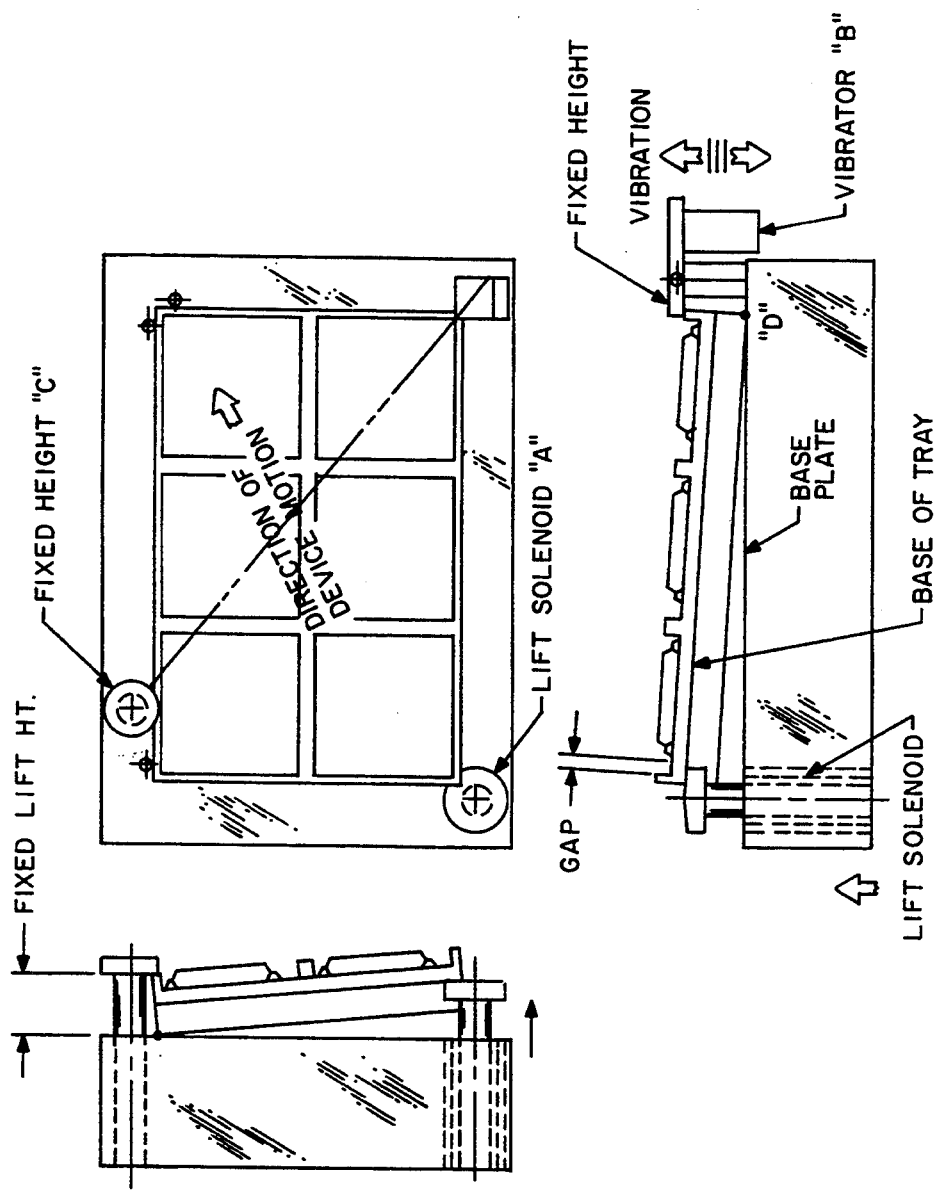
FIG. 13 is a section view of a lift and vibration device that banks the devices against the lower walls of their respective pockets (parallel to the long side of the tray)

For example, the following uncertainties exist in typical commercial trays (FIGS. 13, 20) that are used to hold integrated circuit devices:

Length and width of tray: uncertainty of ±0.010 inch.

Location of pocket within the tray: uncertainty of ±0.016 inch.

Size of the tray pocket: uncertainty of ±0.005 inch.

Additionally, the following uncertainties are typical with respect to the geometric characteristics of the integrated circuit devices themselves:

Body size (length and width) of the device: uncertainty of ±0.003 inch.

Length of lead extension beyond body: uncertainty of ±0.010 inch.

Finally, the location of the pins that locate the trays may be known only to ±0.003 inch.

A typical scan swath suitable for coplanarity measurements on quad flat pack leaded devices is 0.032 inch when the exact location of the lead tips are known. Since the positions are not known the scan swath must be widened.

Figure 15:
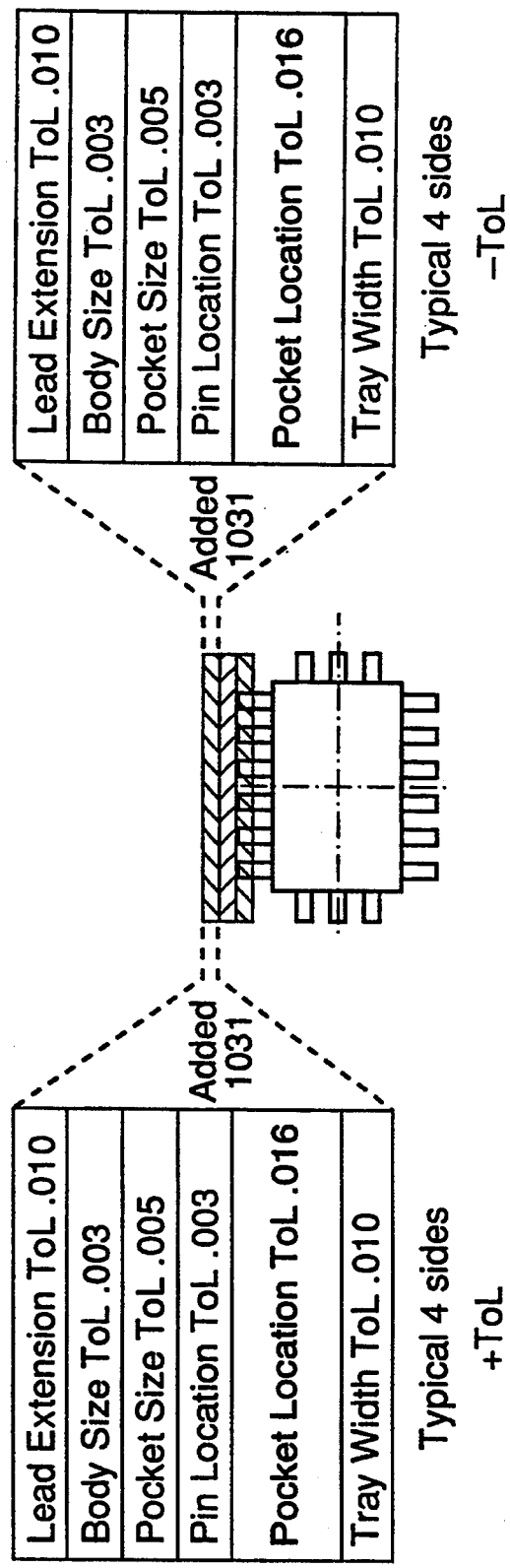
FIG. 15 is a top view of a banked device in a tray pocket showing the area requiring scanning to make proper measurements and the additional area that must be scanned due to mechanical tolerances.

Adding the preceding tolerances for tray, devices, and banking pins yields ±0.047 inch which increases a typical swath that must be scanned from 0.032 inch to 0.032 inch +2*0.047 inch or 0.096 inches. The required scan is almost four times the theoretical scan due to the build up of the various tolerances. This is shown in FIG. 15 which compares the area required for proper measurement 1030 with the added area needed for the geometric tolerances 1031.

Figure 15A:
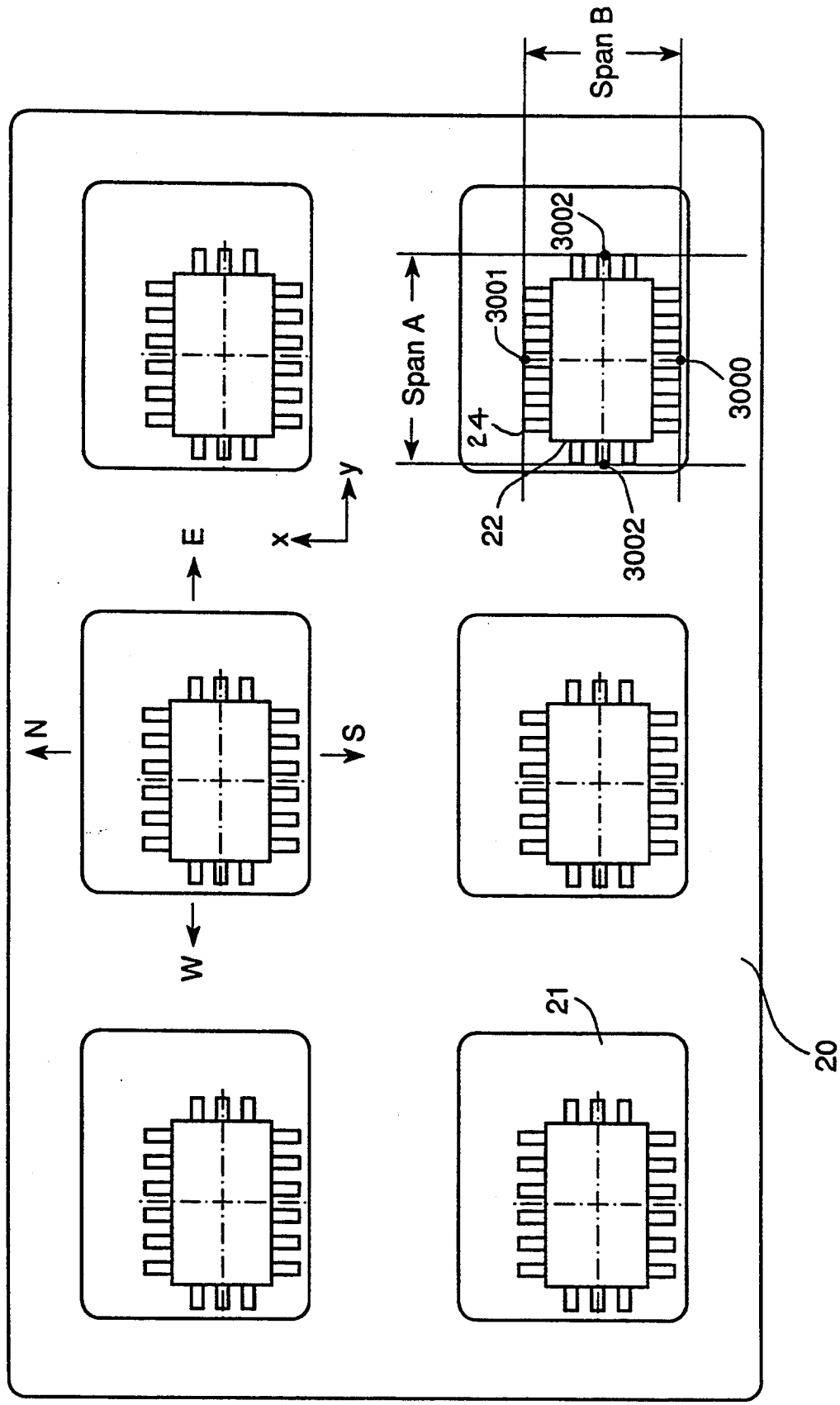
FIG. 15a is a top view of an arrangement in which the tray geometry tolerances can be removed.
Figure 16:
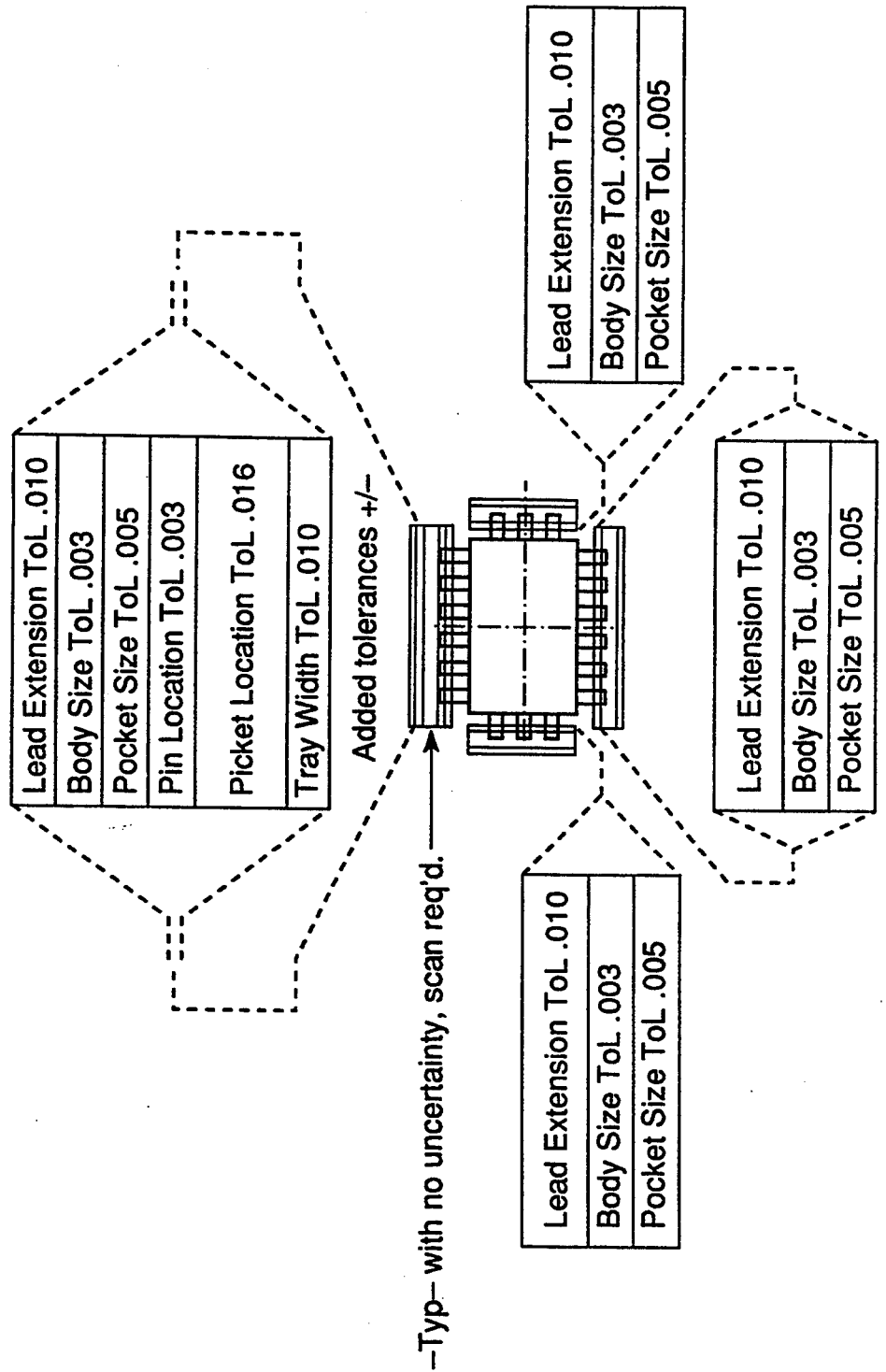
FIG. 16 is a top view of a banked device in a tray pocket showing the area requiring scanning to make proper measurements and the reduction of the additional area for three of the sides when the lead tips on the first side have been located and use is made of apriori dimensional information.

However, if the first sides of the devices are scanned to find the lead tips in accordance with the current invention, and this information is used constructively, the remaining sides of the devices may be scanned using a reduced set of tolerances. The tray geometry tolerances can be removed. It can be seen from FIG. 15A that if point 3000 representing the center of a group of lead tip edges on one side of a device is found, it forms a known starting point for locating the other groups. The corresponding point 3001 for the group on the opposite side is offset from point 3000 by + and x mount equal to x=Span B. The points 3002 corresponding to the groups of leads on each of the remaining sides are located offset from point 3000 by an amount in y of ± Span A/2. Span A and Span B are geometric measurements normally associated with leaded integrated circuit devices of the Quad Flat Pack type. For the remaining sides only two tolerances remain, ±0.003 for body width variation and ±0.010 for lead extension beyond the body. Thus the scan width required is 0.032 inch +2*0.013 inch, or 0.045 inch, an improvement of almost 3:1 over the scan width for the first side. This improvement is shown in FIG. 16 which highlights the difference between the original added scan area 1031 and the reduced scan area 1032 which results when only the body size and lead extension tolerances have to be added.

Figure 14:
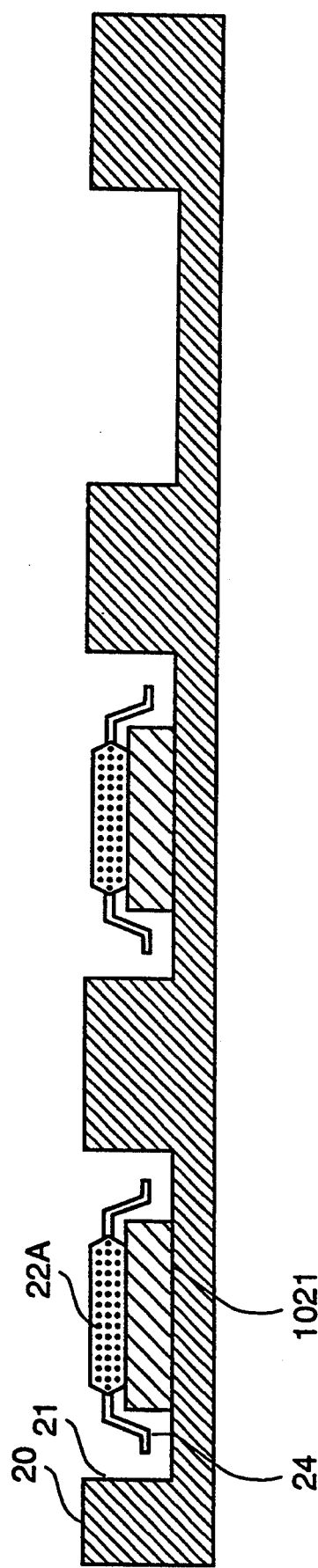
FIG. 14 is a sectional view showing a device located by banking in a tray with a pedestal.

Because the device bodies may be supported by pedestals located in the tray pockets it is optimum to locate the lead tips on one side of the device rather than to remove tolerances by the alternative of locating the pocket wall. This is true even when banking methods are employed, because, depending on the tray construction, the banking may locate the device relative to a hidden internal pedestal rather than to the pocket wall itself. The relationship of the lead tips 24, the device 22A, the pedestal 1021, pocket 21, and tray 20 are shown in FIG. 14. Additionally, the device lead tips themselves are the primary interest, and therefore the most uncertainty will be removed when the tips themselves are used as a reference point.

Further improvement in reducing the area to be scanned can be made by using the lead tip location information from the scans of the other sides to improve on the apriori geometric size and tolerance information. For instance, in the preceding example, the apriori tolerance of 0.026 inch due to body size and lead extension was used to widen the required scan of 0.032 inch. However, if all of the parts in a tray are from the same lot, then lead tip location information from scanning the remaining sides of the devices in a tray can be logically used to find the offsets from these sides to their corresponding first side positions for future trays. Lead tip information from the future trays can be used to further refine estimates of the offsets and even be used to better estimate the expected position of lead tips for the first scan.

Tracking of lead tip data can provide an observed mean value for both the initial location of the first side and the expected offset of each subsequent scanned side from the central location of the lead tip found when the first side is scanned, and a maximum peak-to-peak value for observed deviations from the mean and an estimate of the variance of the offsets about the mean value. For instance, for a typical tray which contains more than thirty devices from one lot it would be typical to find a peak-to-peak deviation for an offset of only 0.010 inch and a variance of 0.002 inch. Software in the controller can then adjust the total additional scan width for future scans of the same lot to 6 times the estimated standard deviation (variance), or 0.012 inch. Thus, the scan width would be set to 0.032 inch+0.012 inch=0.044 inch, a significant reduction from the initial apriori worst case based assumption of total body size plus lead extension tolerance of 0.032 inch+0.026 inch=0.058 inch.

When the devices are banked against either one or two sides of the pocket, or against one or two sides of the pedestal in the pocket, the lead tips 24 on corresponding sides (E-W; N-S) of the devices will lie in straight lines parallel to one of two orthogonal directions, as is evident from FIG. 9 and FIG. 11. Lead tips on the East and West sides of the devices will form straight lines parallel to each other and orthogonal to the straight lines formed by leads on the North and South sides of the devices. Because the nominal direction of the lines and their nominal length is known apriori, it is sufficient to find the midpoint or center of gravity of the line through the lead tips on a side to describe the location of all of the leads on that side.

Figure 17:
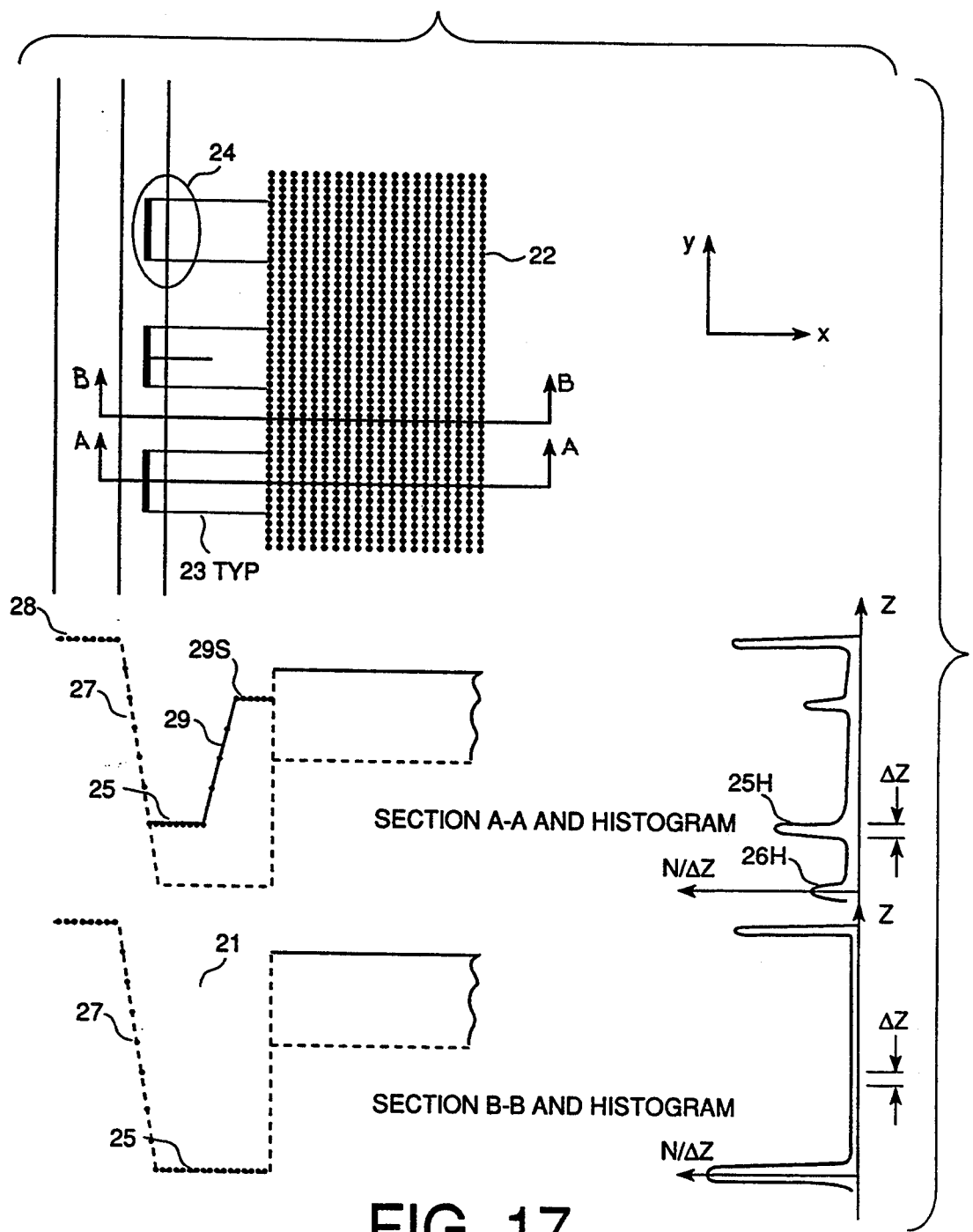
FIG. 17 is a top view of a banked device in a tray pocket showing the further reduction of scanning area required when scanning future trays based upon analysis of measured dimensional information and its variation.

The individual lead tips may be found by using standard image processing techniques to separate them from other features of the devices and trays. This is illustrated in FIG. 17 which shows a greatly enlarged top view of a device 22 with leads 23 and lead tips 24. Sections AA and BB show the 3-D surface data that would be obtained by taking thin slices parallel to the X-Z plane through the scanned data in regions where leads exist and the data found in the gaps between leads, respectively. 3-D data returned from surface points on the pocket floor 26, the top surface of the tray between pockets 28, the walls of the pockets 27, and from the lead tips 25, the lead risers 29 and the lead shoulders 29S are also shown in sections AA and BB. Shadowed areas are shown in dashed lines. In the FIG. 17 diagram it can be seen that when points at one of the sections lie on a near horizontal surface (such as at the lead tip and pocket floor) there will be many points in a small interval of height ($\Delta Z$). Where surfaces are nearly vertical such as on the lead riser or pocket wall, there will be very few points in a small interval of height ($\Delta Z$).

The number or points that lie in a given height interval for the region in and adjacent to the sections is shown plotted in the histograms to the right of the sections.

It can be immediately seen from the two sections and their histograms that the gaps between leads are identified by histograms with only two peaks, one corresponding to the floor of the pocket and one corresponding to the top of the tray in the area between the pockets. It should be noted that often little or no data will be found corresponding to the tops of the devices due to the narrowness of the scans. If such data is found it will lie just below that of the tray tops. Thus, even if there are three peaks, there still will be a sizeable $\Delta Z$ distance between the bottom-most peak in the histogram (the pocket floor) and the next highest one in regions representing gaps. The gaps between the leads are easily found by taking sections through the data at intervals of $\Delta y$ that are significantly less than the lead widths, and evaluating the resulting histograms. Similarly, areas containing the lead tips are found by noting that they exist between the gaps and contain a strong peak in their histograms just above the height of the peaks due to the floor in the "gap" histograms. Histograms of slices through the data that contain the lead tips may also contain a small peak due to data from the floor of the pocket 26 when the lead 25 does not fully shadow it.

This creates a small peak 26H in the section BB histogram which may be separated from the peak due to the leads 25H because it occurs at exactly the same Z height as the large peak representing the floor in the histograms of the sections in the gaps between the leads.

Figure 18:
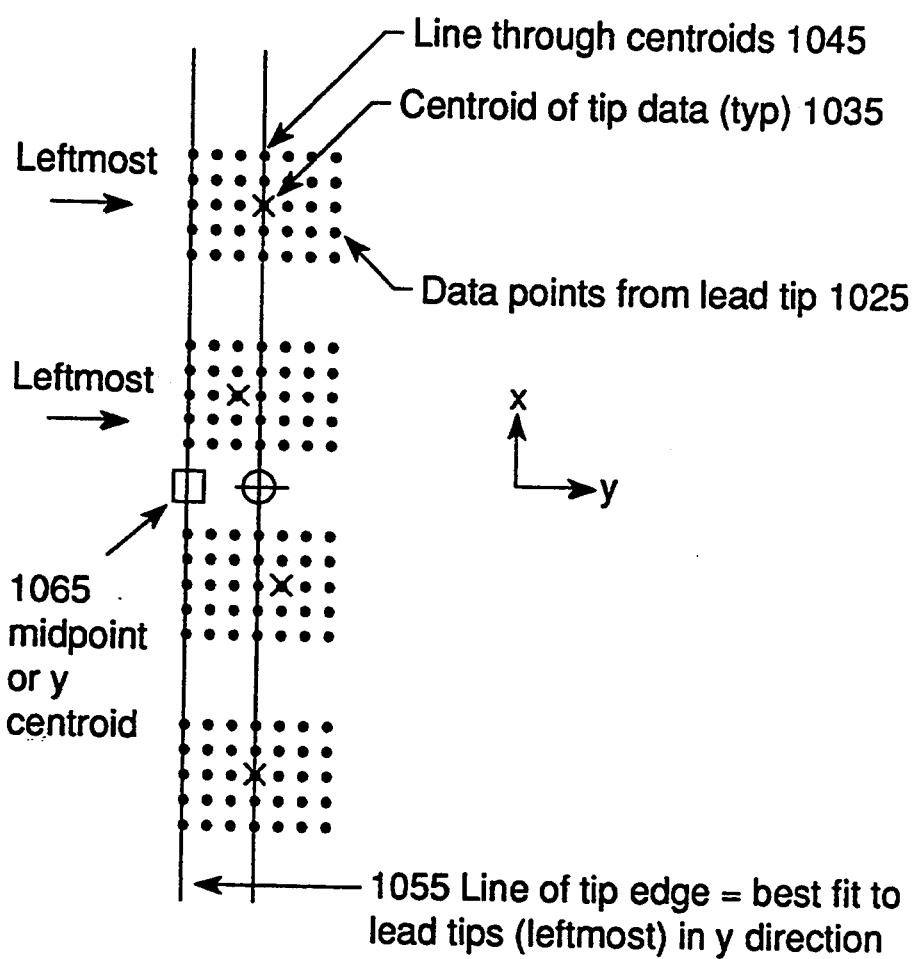
FIG. 18 is a schematic view of the final data used for the position of the lead tips.

By processing only closely-spaced 3-D data taken in the small $\Delta Z$ band represented by the histogram region 25H, it is possible to segregate the individual groups of lead tip data from all other data as is shown in FIG. 18 for a banked device. The left-most (smallest x) position in each individual cluster represents the tip position of that lead in x. Similarly, the centroid in y of the data cluster representing a lead tip represents the y axis position of that lead. The "y" centroid of all of the individual centroids from the lead tip data clusters represents the groups (one side of a device) lead tip positions in y. Similarly the x centroid of all of the lead tip positions found in "x" provides the overall position of that group of leads in "x". This x position is not as important as a line through the lead tip edge data because that line is representative of the boundary of the lead tips, a critical area that must be scanned. Taking the centroid of the individual centroids in a group of equally-spaced leads is equivalent to obtaining the offset of the best fit line through the data. Information regarding the direction of the line is lost if processing is kept to only obtaining the centroid. If course, if desired, calculations to obtain the "best fit line" can be solved through the use of minimum least square error methods, which are widely known. Such calculations provide both the line offset and the line slope in x and y.

The final data used for the position of the lead tips is shown by the line 1055 (parallel to the y axis) which passes through the x coordinate that is the average of the left-most x coordinates of the group of lead tips. The midpoint of the lead group is given by the average of the y centroids of the individual lead tips and is marked by the small box 1065.

When the devices are not banked, the scan paths to scan the first sides of the devices must be made quite wide but the follow up scans can be made quite narrow based on the information from the first scan, and if all devices are from the same lot can be narrowed still further. This is shown in FIGS. 19A, 19B, and 19C for double-banked, singly-banked, and unbanked devices. The movement away from the banked position has been heightened from what is normally found to make the diagrams easier to follow.

When the devices are banked against either one or two sides of the pocket, or against one or two sides of the pedestal in the pocket, the lead tips 24 corresponding sides (E-W; N-S) of the devices will lie in straight lines parallel to one of two orthogonal directions, as is evident from FIG. 9 and FIG. 11. Lead tips on the East and West sides of the devices will form straight lines parallel to each other and orthogonal to the straight lines formed by leads on the North and South sides of the devices. Because the nominal direction of the lines and their normal length is known apriori, it is sufficient to find the midpoint or center of gravity of the line through the lead tips on a side to describe the location of all of the leads on that side.

The individual lead tips may be found by using standard image processing techniques to separate them from other features of the devices and trays. This is illustrated in FIG. 17 which shows a greatly enlarged top view of a device 22 with leads 23 and lead tips 24. Sections AA and BB show the 3-D surface data that would be obtained by taking thin slices parallel to the X-Z plane through the scanned data in regions where leads exist and the data found in the gaps between leads, respectively. 3-D data returned from surface points on the pocket floor 26, the top surface of the tray between pockets 28, the walls of the pockets 27, and from the lead tips 25, the lead risers 29 and the lead shoulders 29S are also shown in sections AA and BB. Shadowed areas are shown in dashed lines. In the FIG. 17 diagram it can be seen that when points at one of the sections lie on a near horizontal surface (such as at the lead tip and pocket floor) there will be many points in a small interval of height ($\Delta Z$). Where surfaces are nearly vertical such as on the lead riser or pocket wall, there will be very few points in a small interval of height ($\Delta Z$).

The number or points that lie in a given height interval for the region in and adjacent to the sections is shown plotted in the histograms to the right of the sections.

It can be immediately seen from the two sections and their histograms that the gaps between leads are identified by histograms with only two peaks, one corresponding to the floor of the pocket and one corresponding to the top of the tray in the area between the pockets. It should be noted that often little or no data will be found corresponding to the tops of the devices due to the narrowness of the scans. If such data is found it will lie just below that of the tray tops. Thus, even if there are three peaks, there still will be sizeable $\Delta Z$ distance between the bottom-most peak in the histogram (the pocket floor) and the next highest one in regions representing gaps. The gaps between the leads are easily found by taking sections through the data at intervals of $\Delta y$ that are significantly less than the lead widths and evaluating the resulting histograms. Similarly, areas containing the lead tips are found by noting that they exist between the gaps and contain a strong peak in their histograms just above the height of the peaks due to the floor in the "gap" histograms. By processing only closely-spaced 3-D data taken in the small $\Delta Z$ band represented by the histogram region 25H, it is possible to segregate the individual groups of lead tip data from all other data as is shown in FIG. 18 for a banked device. The left most (smallest x) position in each individual cluster represents the tip position of that lead in x. As an alternative, the average value of the x coordinates of left-most (smallest x) N points, where N is a small number preselected according to the expected number of data points across the width of a lead tip, may be used to represent the lead tip edge. Similarly, the centroid in y of the data cluster representing a lead tip represents the y axis position of that lead. The "y" centroid of all of the individual centroids from the lead tip data clusters represents the groups (one side of a device) lead tip positions in y. Similarly the x centroid of all of the lead tip positions found in "x" provides the overall position of that group of leads in "x". This x position is not as important as a line through the lead tip edge data because that line is representative of the boundary of the lead tips, a critical area that must be scanned. Taking the centroid of the individual centroids in a group of equally-spaced leads is equivalent to obtaining the offset of the best fit line through the data. Information regarding the direction of the line is lost if processing is kept to only obtaining the centroid. Of course, if desired, calculations to obtain the "best fit line" can be solved through the use of minimum least square error methods, which are widely known. Such calculations provide both the line offset and the line slope in x and y.

The final data used for the position of the lead tips is shown by the line 1055 (parallel to the y axis) which passes through the x coordinate that is the average of the left-most x coordinates of the group of lead tips. The midpoint of the lead group is given by the average of the y centroids of the individual lead tips and is marked by the small box 1065.

Figure 19:
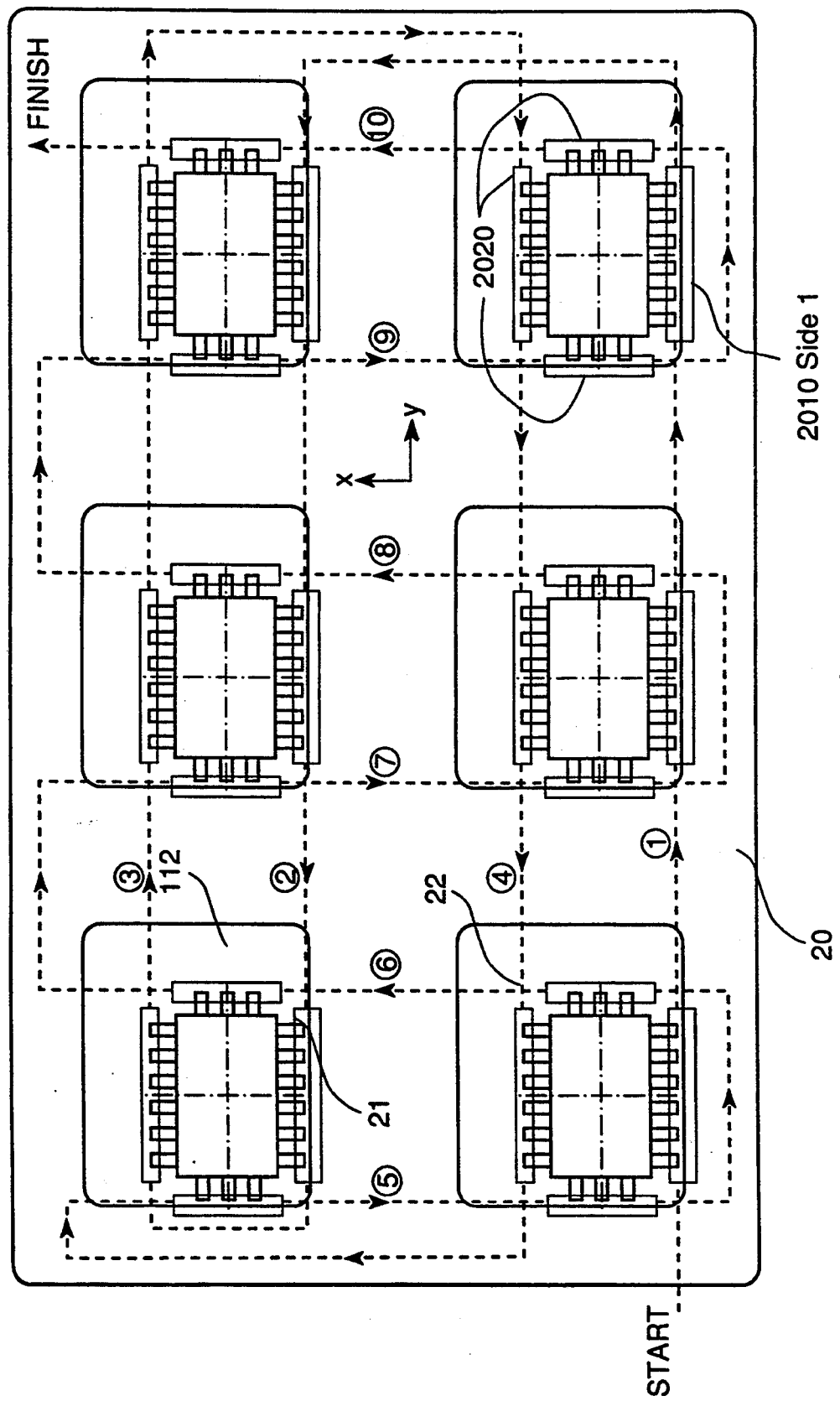
FIG. 19 is a top view showing devices that are doubly-banked in tray pockets.
Figure 20:
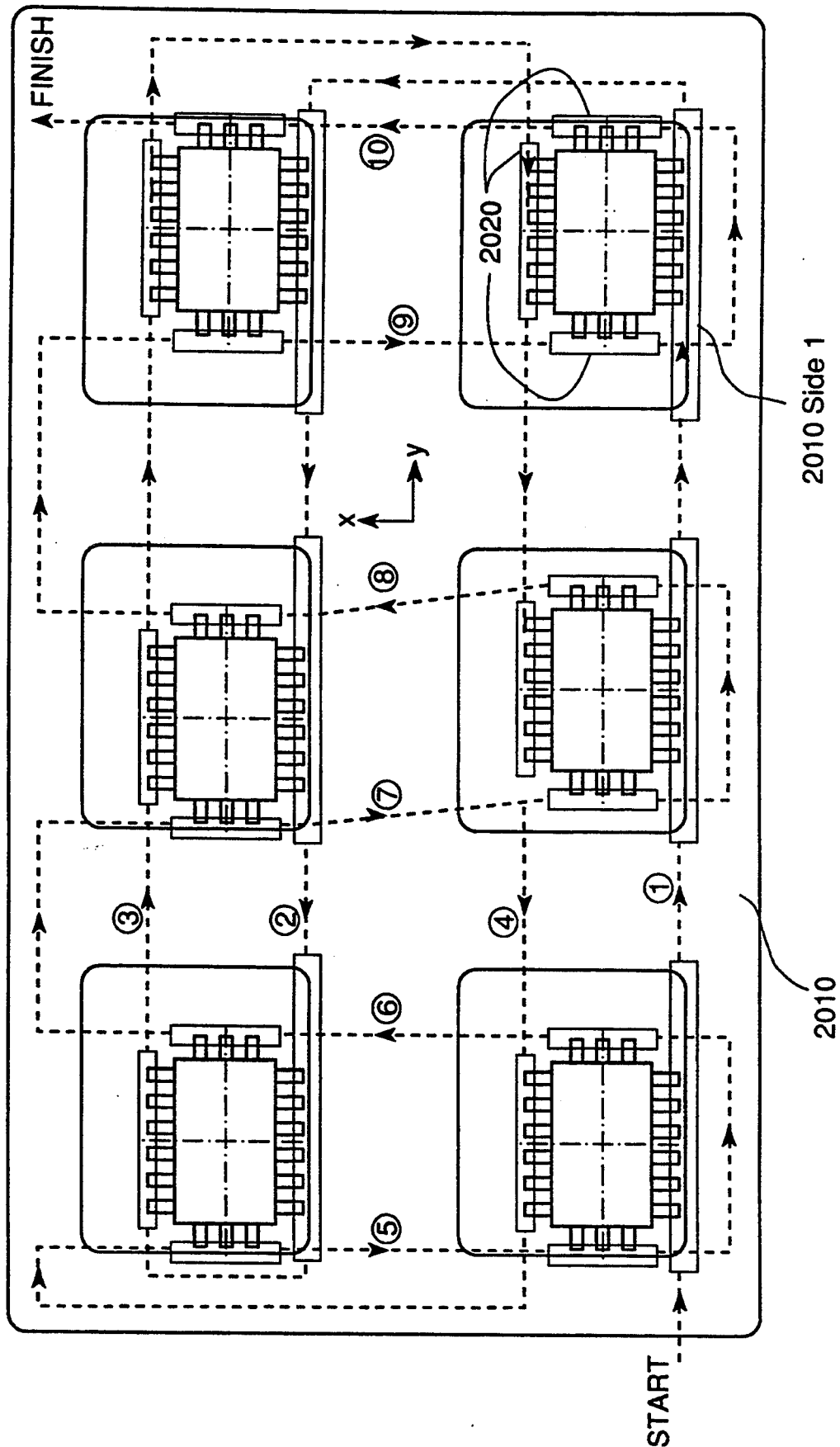
FIG. 20 is a top view of devices that are singly-banked.
Figure 21:
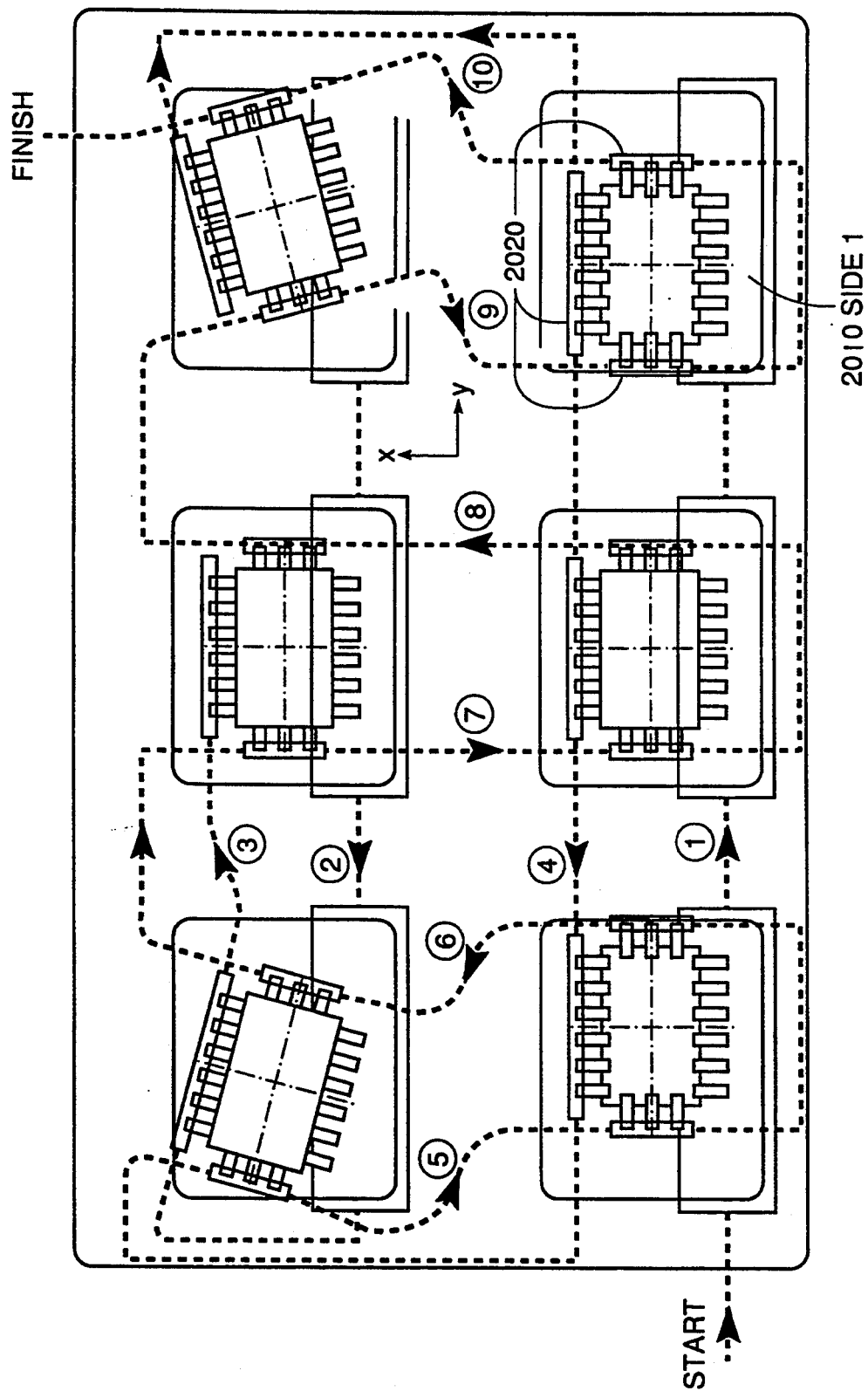
FIG. 21 is atop view of devices that are unbanked.

When the devices are not banked the scan paths to scan the first sides of the devices must be made quite wide but the follow up scans can be made quite narrow based on the information from the first scan, and if all devices are from the same lot can be narrowed still further. This is shown in FIGS. 19, 20, and 21 for double-banked, singly-banked, and unbanked devices. The movement away from the banked position has been heightened from what is normally found to make the diagrams easier to follow.

In FIG. 19 the boxes 2010 are typical of the width and area to be covered in the initial scans of the devices on side 1, and the boxes 2020 are typical of the width and area of subsequent scans on sides 2, 3 and 4, when using intelligent scanning. FIG. 19 shows the case where devices are doubly-banked in the tray pockets. FIGS. 20 and 21 also show the initial 2010 and subsequent 2020 scan areas and widths for the cases of singly-banked devices and unbanked devices, respectively.

As is evident from FIGS. 19 and 20, the area and width of the initial scans 2010 must be increased above the FIG. 19 doubly-banked case to make up for the device location uncertainty in the y direction when the devices are only singly-banked as in FIG. 20. In this case, scan width is unaffected but scan length must be increased. In comparing FIG. 21, devices unbanked, with FIG. 20, devices singly banked, it can be seen that the initial scan path 2010 must be also widened to account for the additional device location uncertainty in the x direction. In all of FIGS. 19-21, the subsequent scans 2020 are of equal size since once the initial scan locates the device position and/or orientation it is immaterial whether the devices were banked or not. Only device geometry size uncertainties remain as tolerances to be added to the desired scan width and area. FIGS. 19 and 20 make evident the fact that any banking lines the device sides up in north/south and east/west directions (parallel to the x and y axes). Thus, in the singly- or doubly-banked case the computations to locate lead tips reduce to the simple case of locating one point for each side 1 that in one coordinate corresponds to the midpoint of the side (having an equal number of leads or gaps to each side) and corresponds in the other coordinate to the lead tips front edge position.

In the unbanked case of FIG. 21 it is required that the slope of the side 1 leads be found since this is equivalent to determining the device orientation which, when added to the side 1 location information, defines the expected position of the other sides for subsequent scanning. In this case it is required that a full-line fit to the lead tip data be performed so that the orientation information becomes available.

In FIGS. 19-21 useful lead tray scanning paths for accomplishing the objective of locating devices via initial scans of one side of each device and following with subsequent scans according to the location information gathered are shown by dashed lines. The dashed lines are marked with arrow heads indicating the scan path direction, and with circled numbers indicating major (cross tray) scan segments by the order in which they occur.

It can be seen that when devices are doubly-banked or singly-banked to the tray pockets all lead scanning is done along the major coordinate axes (either x or y) so that only one scan axis is active at a time. When the devices are singly-banked in the pockets it is sometimes required to simultaneously use the axis transverse to the direction of scanning (the axis corresponding to the device location uncertainty) to ensure that the scan path crosses the desired portion of the lead tips. This only occurs in between devices and such transverse motion should not start until leaving a scanned area, and should be finished before entering the new scan area in order to minimize accelerations that may induce vibration. Paths illustrative of two axis motion between data taking areas are shown in FIG. 20, in scan path segments 5, 6, 7 and 8.

When devices are completely unbanked in the tray pockets as in FIG. 21, it may be necessary to scan taking data while two axes are in motion. This is shown in FIG. 21 during major cross tray scan segments 3, 5, 6, 9 and 10. It can be seen that the data taking scans 2010, 2020 are still all performed during straight line motion rather than during curved motion so that no acceleration is present and consequential vibration is minimized. However, acceleration is required traveling in between devices in order to enter the scan areas at the proper position, velocity, and direction. Such acceleration is seen in the curved path areas of FIGS. 2, 3, 5, 6, 9 and 10.

In performing the scanning across the full tray width or length, the requirement to obtain both wide and narrow fields of view can be accomplished either by making the sensor field of view adjustable or by using a narrow field of view sensor that scans adjacent fields of view sequentially to synthesize a wide field of view. Except for the extra "turn around" times, the two methods are generally equivalent from a speed and resolution point of view, because the data taking time is much larger than the travel time between scanned areas in the normal tray which is almost completely filled with devices with very little space between them.

Figure 22:
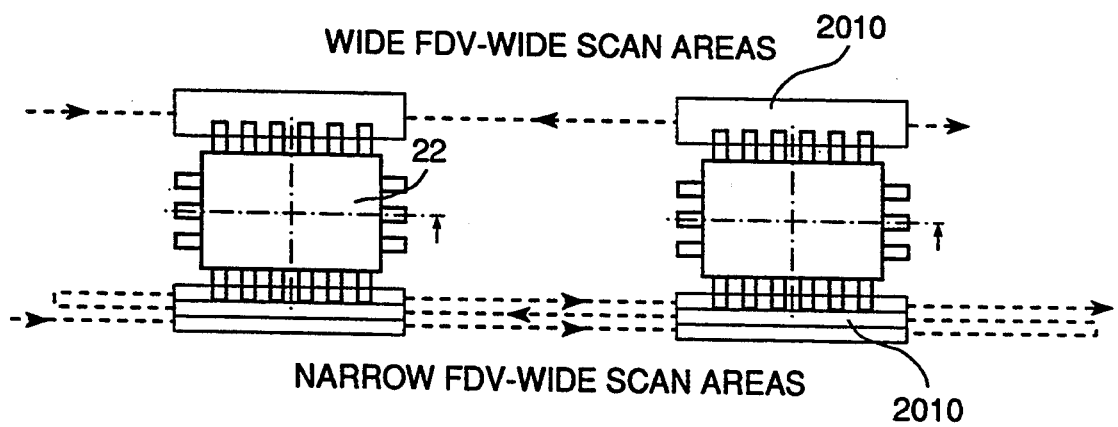
FIG. 22 is a schematic view showing the equivalency between the two method shown on opposite sides of the same devices.

FIG. 22 shows the equivalency between the two methods which are shown on opposite sides of the same devices for illustrative purposes. Therefore any of the numbered scan paths in FIGS. 19, 20 and 21, or scan paths in the previous figures, may be replaced with two or more narrower scans. None of the scanning patterns will change when the wide scans are replaced by an odd number of narrower scans; the patterns will be altered when an even number of scans are used but in each such case, a new scan pattern may be generated to accomplish the same end of scanning all parts in a tray.

What is claimed is:

1. A method of obtaining three-dimensional data from parts in pockets in trays comprising the steps of: providing a tray with tray areas located and sized according to a predetermined pattern dependent on apriori geometric and tolerance information defining said tray and pockets and parts in said tray; scanning first ones of said tray areas to obtain location of a first feature on each said parts; scanning at least a second time said ones of said tray areas to obtain three-dimensional data for at least a second feature on each said parts where said scanning at least a second time said ones of said tray areas is located by offsets and rotations obtained from locations of said first feature.

2. A method as defined in claim 1, including the steps of inspecting a statistically significant number of parts; and generating said predetermined pattern in said first scan and said offsets and rotations in said at least second scan by updating said apriori geometric and tolerance information from locations of said first feature and said second feature obtained from said inspections.

* * * * *